(12) United States Patent
Cha

(10) Patent No.: US 8,981,453 B2
(45) Date of Patent: Mar. 17, 2015

(54) NONVOLATILE MEMORY DEVICE AND METHOD FOR FABRICATING THE SAME

(75) Inventor: Jae-han Cha, Chungbuk (KR)

(73) Assignee: Magnachip Semiconductor, Ltd. (KR)

( * ) Notice: Subject to any disclaimer, the term of this patent is extended or adjusted under 35 U.S.C. 154(b) by 954 days.

(21) Appl. No.: 12/959,332

(22) Filed: Dec. 2, 2010

(65) Prior Publication Data

US 2011/0249500 A1 Oct. 13, 2011

(30) Foreign Application Priority Data

Apr. 12, 2010 (KR) .................. 10-2010-0033391

(51) Int. Cl.
*H01L 29/788* (2006.01)
*H01L 21/28* (2006.01)
*H01L 29/423* (2006.01)
*H01L 29/66* (2006.01)

(52) U.S. Cl.
CPC .... *H01L 21/28273* (2013.01); *H01L 29/42324* (2013.01); *H01L 29/66825* (2013.01); *H01L 29/7883* (2013.01)
USPC ........ 257/316; 257/300; 257/319; 257/E29.3; 257/E29.304; 257/E27.086

(58) Field of Classification Search
CPC .............. G11C 11/24; G11C 16/0408; G11C 16/0416; G11C 16/0425; H01L 29/788; H01L 29/7883; H01L 27/108; H01L 27/10805; H01L 27/10808; H01L 27/10811; H01L 27/11517; H01L 27/11521
USPC ................. 365/185.01, 185.05, 185.08, 149; 257/314–316, 319, 321, 326, E29.3, 257/E29.304, E27.085–E27.087, E27.103, 257/300

See application file for complete search history.

(56) References Cited

U.S. PATENT DOCUMENTS

| | | | | |
|---|---|---|---|---|
| 5,981,335 A * | 11/1999 | Chi | ............................... | 438/253 |
| 6,232,173 B1 * | 5/2001 | Hsu et al. | ...................... | 438/253 |
| 6,256,225 B1 * | 7/2001 | Noble et al. | ............. | 365/185.05 |
| 7,408,230 B2 * | 8/2008 | Park et al. | ...................... | 257/390 |
| 7,471,570 B2 * | 12/2008 | Morton et al. | ........... | 365/185.28 |
| 7,688,627 B2 * | 3/2010 | Haggag et al. | ........... | 365/185.08 |
| 2003/0127694 A1 * | 7/2003 | Morton et al. | ................ | 257/371 |

* cited by examiner

*Primary Examiner* — Allison P Bernstein
(74) *Attorney, Agent, or Firm* — Blakely Sokoloff Taylor & Zafman

(57) ABSTRACT

A nonvolatile memory device includes a unit cell with a transistor and a capacitor. The transistor is disposed on a substrate having a tunneling region and a channel region and includes a floating gate crossing both the tunneling region and the channel region. The capacitor is coupled to the floating gate.

39 Claims, 25 Drawing Sheets

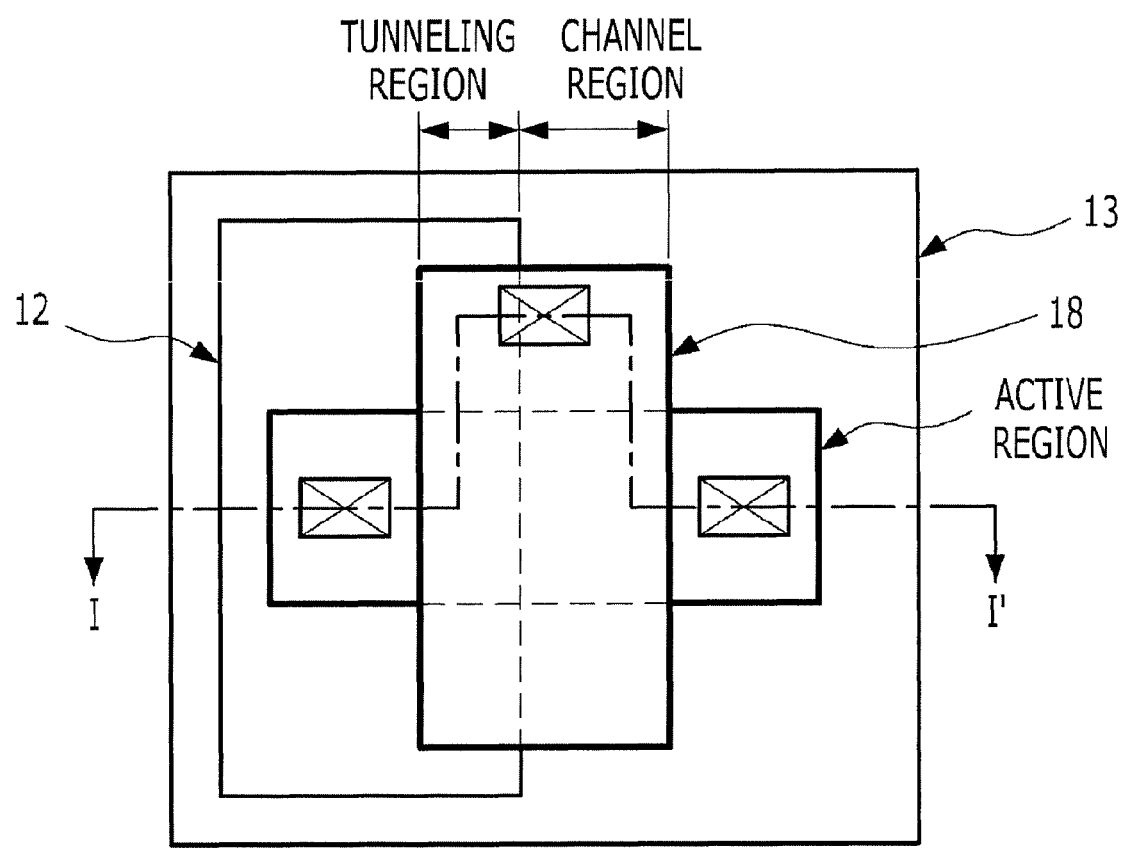

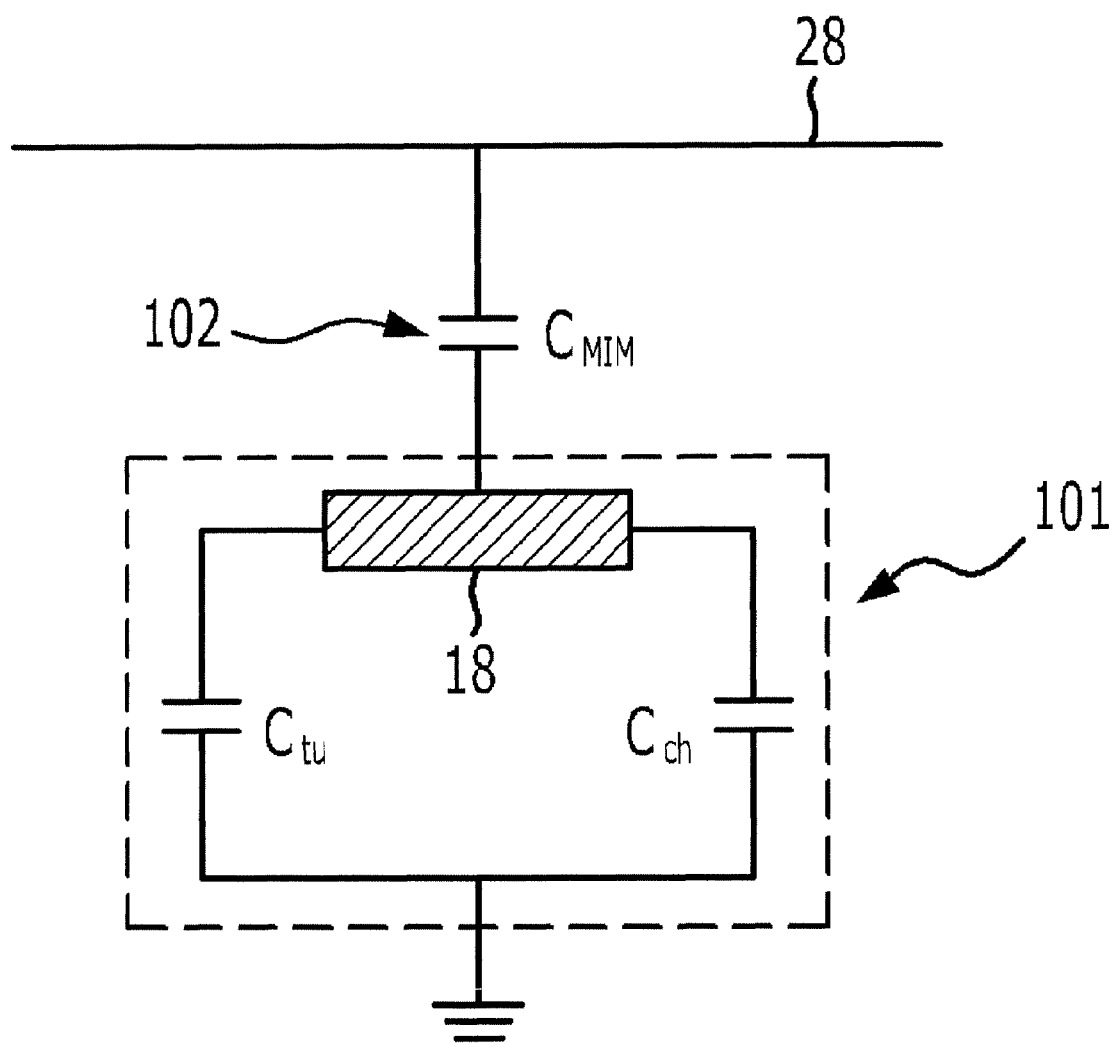

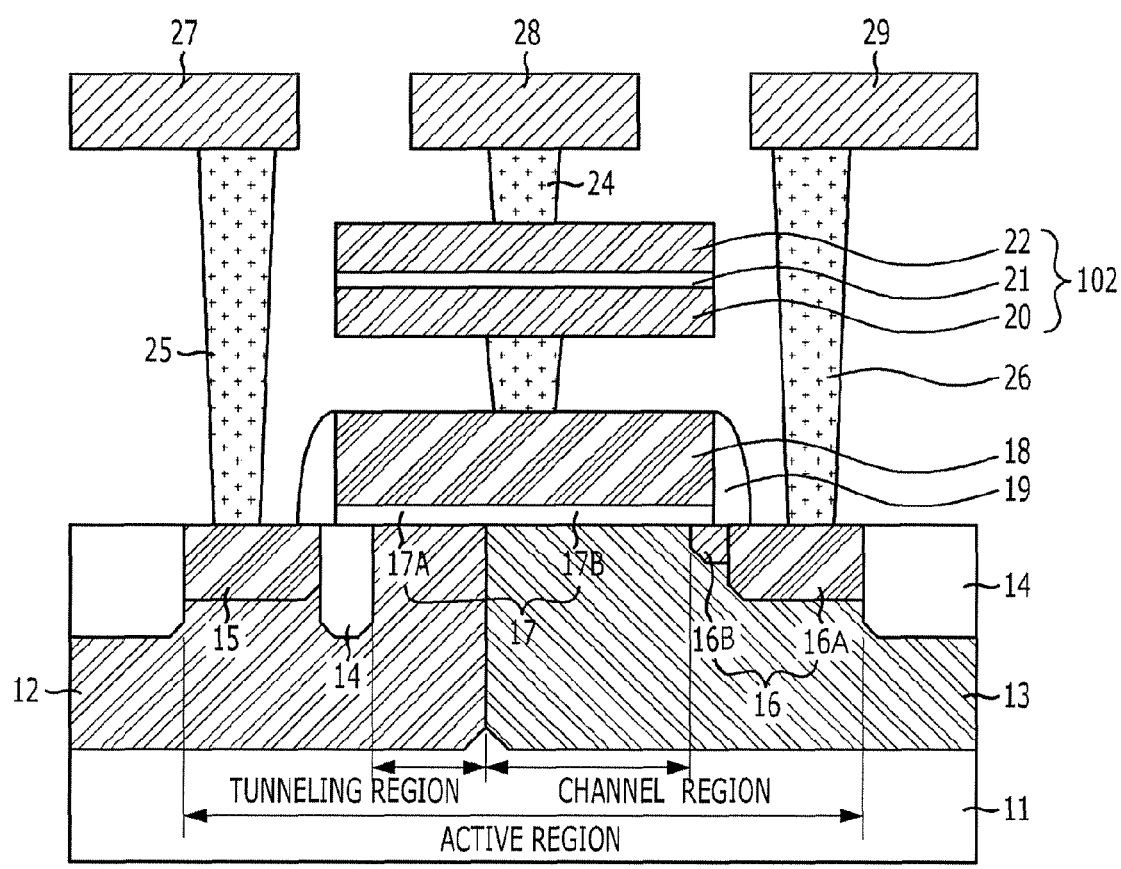

NONVOLATILE MEMORY DEVICE AND METHOD FOR FABRICATING THE SAME

CROSS-REFERENCE TO RELATED APPLICATIONS

The present application claims priority of Korean Patent Application No. 10-2010-0033391, filed on Apr. 12, 2010, which is incorporated herein by reference in its entirety.

BACKGROUND OF THE INVENTION

Exemplary embodiments of the present invention relate to a semiconductor device fabrication technology, and more particularly, to a nonvolatile memory device having a single polysilicon floating gate.

In order to implement lightweight and slim systems, research into system on a chip (SoC) has been actively conducted to implement organic operations between a plurality of integrated semiconductor devices. An SoC may be configured by integrating a logic device (e.g., a display device IC (DDI)) and a nonvolatile memory device into a single chip. In the SoC in which the logic device and the nonvolatile memory device are integrated, various types of nonvolatile memory device may be applied, and a suitable nonvolatile memory device is selected according to the purpose of the chip and configuration of the logic device.

As a nonvolatile memory device applied to an SoC, a single gate type multi-time programmable (MTP) or a stack gate type sidewall selective transistor cell (SSTC) is widely used.

However, a typical MTP which uses a hot electron injection in a program operation and uses a Fowler-Nordheim (F-N) tunneling in an erase operation is advantageous in that it can be fabricated by adding about two mask processes to a logic operation, but is disadvantageous in that a size of a unit cell is too large.

On the other hand, the SSTC which uses an F-N tunneling in a program operation and an erase operation is advantageous in that a size of a unit cell is so small that the degree of integration of an SoC can be improved, but is disadvantageous in that fabrication cost and time are increased because its structure is complicated and about 10 mask processes are added.

SUMMARY OF THE INVENTION

An embodiment of the present invention is directed to a nonvolatile memory device, which can be easily applied to an SoC, and a method for fabricating the same.

Another embodiment of the present invention is directed to a nonvolatile memory device, which can be easily implemented, based on a logic process, and a method for fabricating the same.

In accordance with an embodiment of the present invention, a nonvolatile memory device includes: a unit cell including: a transistor disposed on a substrate having a tunneling region and a channel region and including a floating gate crossing both the tunneling region and the channel region; and a capacitor coupled to the floating gate.

The tunneling region and the channel region may include impurity regions formed in the substrate and having complementary conductivity types. The tunneling region may include a first impurity region of a second conductivity type, and the channel region may include a second impurity region of a first conductivity type. The first impurity region and the second impurity region may include logic wells.

The first impurity region and the second impurity region may be contacted with each other under the floating gate. The first impurity region and the second impurity region may be spaced apart from each other by a predetermined interval under the floating gate. The first impurity region and the second impurity region may be partially overlapped with each other under the floating gate.

The nonvolatile memory device may include an isolation layer disposed in the first impurity region and overlapped with one end of the floating gate in such a state that the first impurity region and the second impurity region are contacted with each other, spaced apart from each other, or overlapped with each other.

The nonvolatile memory device may further include a gate dielectric layer disposed between the substrate and the floating gate. The gate dielectric layer may include a first gate dielectric layer in the tunneling region and a second gate dielectric layer in the channel region, and the thickness of the first gate dielectric layer may be substantially equal to the thickness of the second gate dielectric layer. The thickness of the second gate dielectric layer may be larger than the thickness of the first gate dielectric layer.

The capacitor may have any one shape selected from the group consisting of a flat plate shape, a concave shape, a convex shape, a cylindrical shape, and a pillar shape.

The unit cell may further include a junction region in the substrate on one side of the floating gate, on the other side of the floating gate, or on both sides of the floating gate.

The nonvolatile memory device may further include a driving unit configured to control a driving of the unit cell. The driving unit may include an NMOS transistor, a PMOS transistor, or a CMOS transistor in which the NMOS transistor and the PMOS transistor are coupled.

The NMOS transistor may include: an N-type impurity region and a P-type impurity region disposed in the substrate; a gate electrode disposed on the substrate and crossing both the N-type impurity region and the P-type impurity region; a gate dielectric layer disposed between the substrate and the gate electrode; an N-type drain region disposed in the N-type impurity region on one side of the gate electrode; and an N-type source region disposed in the P-type impurity region on the other side of the gate electrode. The nonvolatile memory device may further include an isolation layer disposed in the N-type impurity region, overlapped with one end of the gate electrode, and spacing the N-type drain region from the gate electrode by a predetermined interval.

The PMOS transistor may include: a P-type impurity region and an N-type impurity region disposed in the substrate; a gate electrode disposed on the substrate and crossing both the P-type impurity region and the N-type impurity region; a gate dielectric layer disposed between the substrate and the gate electrode; a P-type drain region disposed in the P-type impurity region on one side of the gate electrode; and a P-type source region disposed in the N-type impurity region on the other side of the gate electrode. The nonvolatile memory device may further include an isolation layer disposed in the P-type impurity region, overlapped with one end of the gate electrode, and spacing the P-type drain region from the gate electrode by a predetermined interval.

The P-type impurity region and the N-type impurity region may include logic wells. The P-type impurity region and the N-type impurity region may be contacted with each other under the gate electrode. The P-type impurity region and the N-type impurity region may be spaced apart from each other by a predetermined interval under the gate electrode. The P-type impurity region and the N-type impurity region may be partially overlapped with each other under the gate electrode.

The substrate may include a P-type substrate, the N-type impurity region may include a logic well, and the P-type impurity region may include the P-type substrate.

The substrate may include an N-type substrate, the P-type impurity region may include a logic well, and the N-type impurity region may include the N-type substrate.

In accordance with another embodiment of the present invention, a nonvolatile memory device includes: a first logic well of a second conductivity type and a second logic well of a first conductivity type disposed in a substrate; a floating gate disposed on the substrate and crossing both the first logic well and the second logic well; a gate dielectric layer disposed between the substrate and the floating gate; a drain region of the second conductivity disposed in the first logic well on one side of the floating gate; a source region of the second conductivity type disposed in the second logic well on the other side of the floating gate; and a capacitor having a structure in which a bottom electrode, a dielectric layer, and a top electrode are sequentially stacked, wherein the bottom electrode is coupled to the floating gate.

The first logic well and the second logic well may be contacted with each other under the floating gate. The first logic well and the second logic well may be spaced apart from each other by a predetermined interval under the floating gate. The first logic well and the second logic well may be partially overlapped with each other under the floating gate.

The nonvolatile memory device may further include an isolation layer provided in the first logic well, overlapped with the floating gate, and spacing the drain region from the floating gate by a predetermined interval, in such a state that the first logic well and the second logic well are contacted with each other, spaced apart from each other by a predetermined interval, or partially overlapped with each other. The first logic well and the second logic well may have the same operating voltage. The first logic well may have a lower operating voltage than the second logic well.

The gate dielectric layer may include a first gate dielectric layer on the first logic well and a second gate dielectric layer on the second logic well, and the thickness of the first gate dielectric layer may be substantially equal to the thickness of the second gate dielectric layer. The thickness of the second gate dielectric layer may be larger than the thickness of the first gate dielectric layer.

The capacitor may have any one shape selected from the group consisting of a flat plate shape, a concave shape, a convex shape, a cylindrical shape, and a pillar shape.

The nonvolatile memory device may further include: a word line coupled to the top electrode of the capacitor; a bit line coupled to the drain region; and a source line coupled to the source region.

Upon a program operation, a program voltage may be applied to the word line and a ground voltage may be applied to the bit line.

Upon an erase operation, an erase voltage may be applied to the bit line and a ground voltage may be applied to the word line. Upon the program operation and the erase operation, the source line may be floated.

Upon a read operation, a read voltage may be applied to the word line, a voltage higher or lower than a ground voltage may be applied to the bit line, and the ground voltage may be applied to the source line.

In accordance with yet another embodiment of the present invention, a method for fabricating a nonvolatile memory device includes: implanting impurity ions into a substrate to form a first logic well of a second conductivity type and a second logic well of a first conductivity type; forming a first insulation layer on the substrate in the second logic well; forming a second insulation layer on the substrate in the first and second logic wells; depositing a conductive layer over the substrate; selectively etching the conductive layer, the first insulation layer, and the second insulation layer to form a floating gate and a gate dielectric layer, wherein the gate dielectric layer includes a first gate dielectric layer including the second insulation layer on the first logic well, and a second gate dielectric layer including the first and second insulation layers on the second logic well; and forming a capacitor coupled to the floating gate.

The forming of the first insulation layer may include: forming a first insulation layer over the substrate; and sequentially performing a mask process and an etching process so that the first insulation layer remains only on the second logic well. The etching process may be performed using a wet etching process.

The first insulation layer may be formed using a low temperature chemical vapor deposition (LTCVD) process. The first insulation layer may include a low temperature oxide layer.

The second insulation layer may be formed using a thermal oxidation process. The second insulation layer may include a thermal oxide layer.

BRIEF DESCRIPTION OF THE DRAWINGS

FIG. 1A is a plan view of a nonvolatile memory device in accordance with a first embodiment of the present invention.

FIG. 2 is a circuit diagram explaining the influence of a capacitance of a capacitor on a coupling ratio of a nonvolatile memory device.

FIGS. 3A and 3B are cross-sectional views of a nonvolatile memory device in accordance with a second embodiment of the present invention.

DESCRIPTION OF SPECIFIC EMBODIMENTS

Figure 1B:
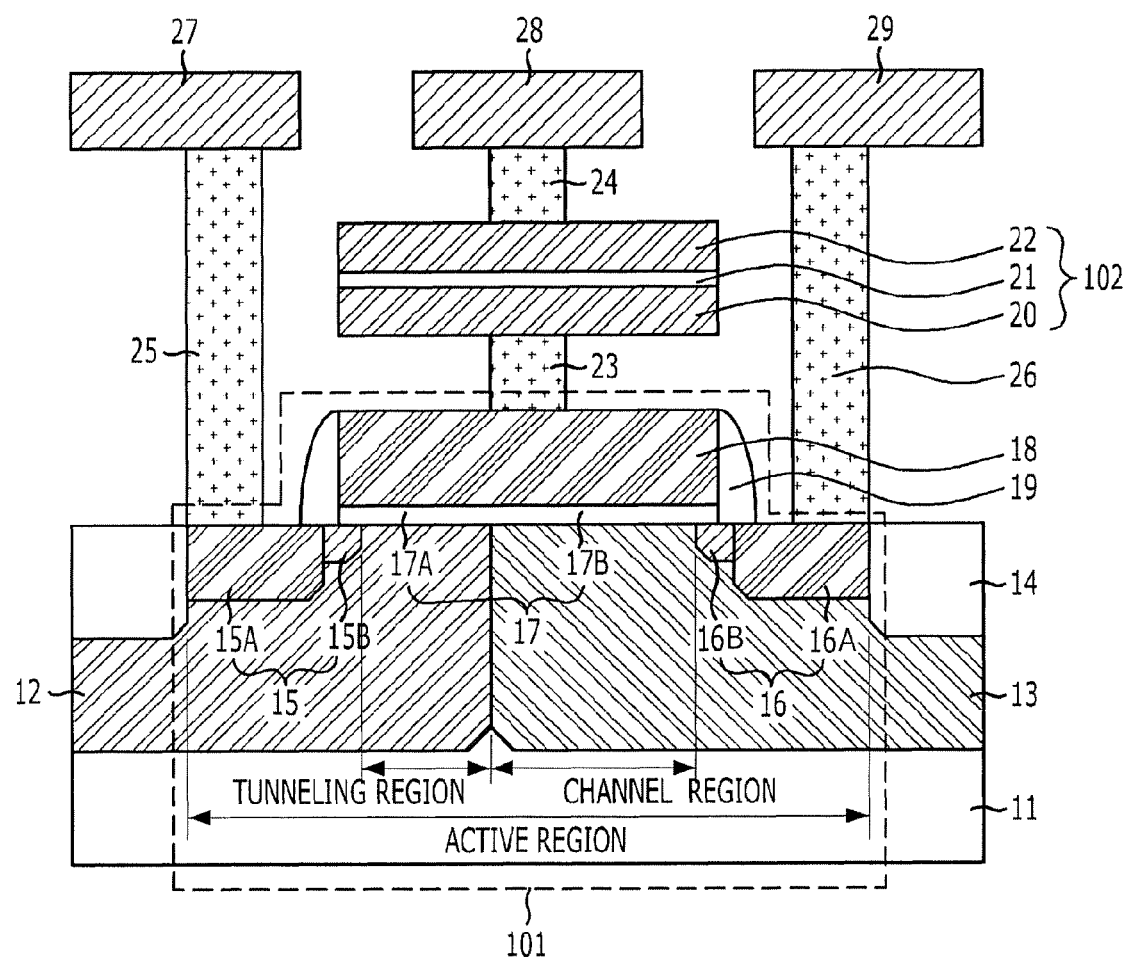
FIGS. 1B and 1C are cross-sectional views taken along line I-I' of FIG. 1.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In order to implement lightweight, miniaturization and multi-function, a semiconductor device fabrication technology has tended to meet demands for SoC. A precondition for reflecting such a trend is that a logic process is used as a backbone to achieve a low-cost process and a high-efficiency process without adding many fabrication processes, and a characteristic of a logic device must not be degraded.

Therefore, the embodiments of the present invention provide a nonvolatile memory device, in which, when an SoC is implemented by integrating a logic device and a nonvolatile memory device, a logic process is used as a backbone to achieve a low-cost process and a high-efficiency process and degradation in a characteristic of a logic device is prevented, and a method for fabricating the same. Examples of the logic device which can be combined with the nonvolatile memory device include various semiconductor devices, such as a power device, a high voltage device, a display driver IC (DDI), and a bipolar-CMOS-DMOS (BCD) device.

Hereinafter, embodiments of the present invention will be described in more detail. In the following description, a first conductivity type and a second conductivity type are complementary conductivity types. When the first conductivity type is a P type, the second conductivity type may be an N type. On the other hand, when the first conductivity type is an N type, the second conductivity type may be a P type. In the following embodiments, it is assumed that the first conductivity type is a P type and the second conductivity type is an N type.

Figure 1C:
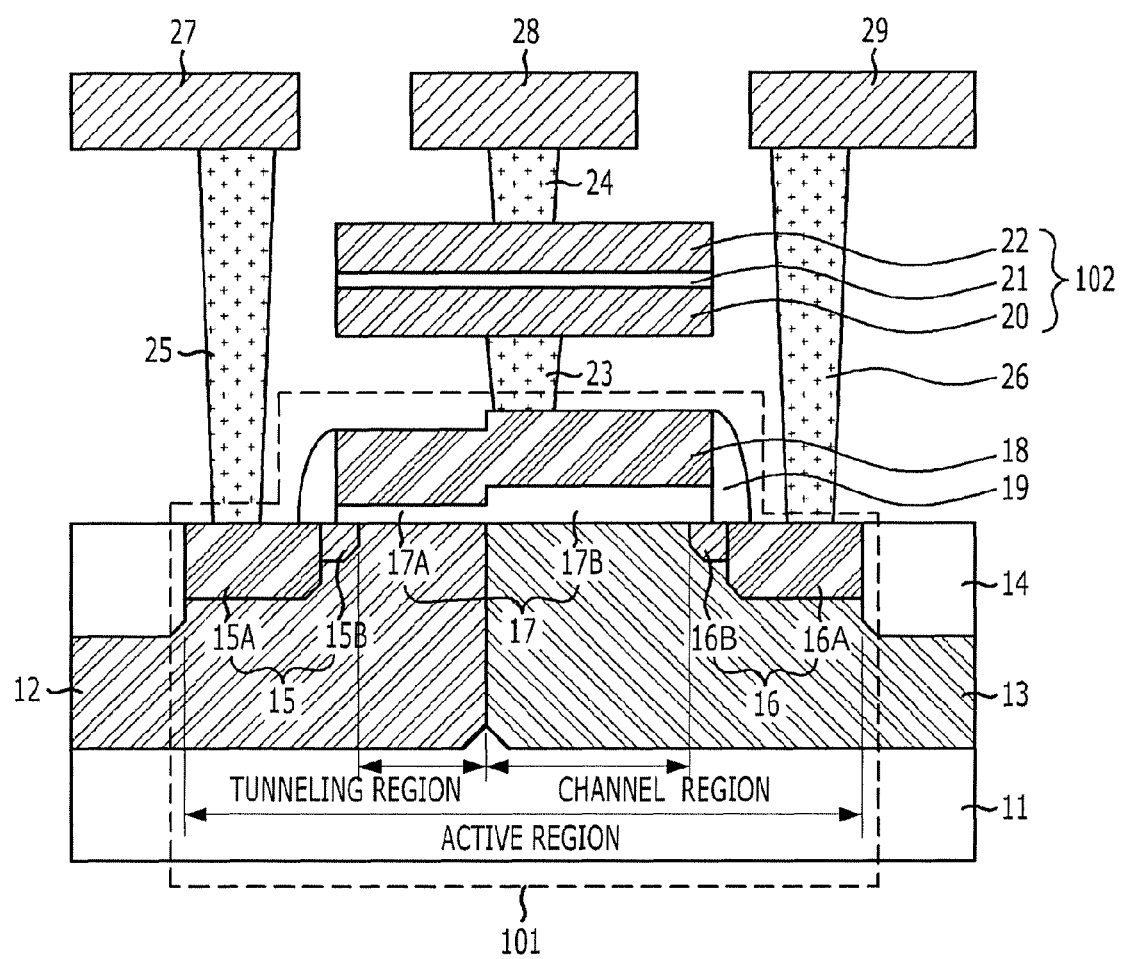

FIGS. 1A to 1C illustrate a nonvolatile memory device in accordance with a first embodiment of the present invention. Specifically, FIG. 1A is a plan view of the nonvolatile memory device in accordance with the first embodiment of the present invention, and FIGS. 1B and 1C are cross-sectional views taken along line I-I' of FIG. 1.

Referring to FIGS. 1A to 1C, a unit cell of the nonvolatile memory device in accordance with the first embodiment of the present invention has a 1T–1C structure including a transistor 101 and a capacitor 102. The transistor 101 includes a floating gate 18 disposed on a substrate 11 with a tunneling region and a channel region, crossing both the tunneling region and the channel region, and formed using a single polysilicon layer. The capacitor 102 is coupled to the floating gate 18. The tunneling region and the channel region may include an impurity region formed in the substrate 11. The impurity region may be a logic well formed using a logic process as a backbone.

More specifically, in the unit cell of the nonvolatile memory device in accordance with the first embodiment of the present invention, a first logic well 12 of a second conductivity type is disposed in the substrate 11 and includes the tunneling region, and a second logic well 13 of a first conductivity type is disposed in the substrate 11 and includes the channel region. An isolation layer 14 is disposed in the substrate 11 to define an active region. A floating gate 18 is disposed on the substrate 11 to cross both the first logic well 12 and the second logic well 13. A gate dielectric layer 17 is disposed between the substrate 11 and the floating gate 18. Spacers 19 are formed on both sidewalls of the floating gate 18 and the gate dielectric layer 17. A drain region 15 of the second conductivity type is disposed in the first logic well 12 on one side of the floating gate 18. A source region 16 of the second conductivity type is disposed in the second logic well 13 on the other side of the floating gate 18. A bottom electrode 20, a dielectric layer 21, and a top electrode 22 are sequentially stacked. A capacitor 102 formed by coupling the bottom electrode 20 to the floating gate 18 through a first plug 23 is disposed.

Also, the unit cell of the nonvolatile memory device in accordance with the first embodiment of the present invention further includes a word line 28 coupled to the top electrode 22 of the capacitor 102 through a second plug 24, a bit line 27 coupled to the drain region 15 of the transistor 101 through a third plug 25, and a source line 29 coupled to the source region 16 of the transistor 101 through a fourth plug 26 to thereby constitute a cell array.

The nonvolatile memory device having the above-described structure is referred to as a Cha Jae Han (CJH) cell named after the inventor of the present invention.

The tunneling region refers to a region where the first logic well 12, the gate dielectric layer 17, and the floating gate 18 are overlapped with each other, and the channel region refers to a region where the second logic well 13, the gate dielectric layer 17, and the floating gate 18 are overlapped with each other. Specifically, the tunneling region in the CJH cell is a region where a program operation of injecting electrons into the floating gate 18 and an erase operation of discharging electrons from the floating gate 18 are performed. The channel region in the CJH cell is a region where a read operation of sensing a change in a threshold voltage, depending on whether electrons exist within the floating gate 18, and a select operation of selecting any one of a plurality of cells are performed.

The substrate 11 may be a silicon substrate doped with an impurity of the first conductivity type, and an impurity doping concentration of the substrate 11 is lower than those of the first and second logic wells 12 and 13.

The first and second logic wells 12 and 13 in the substrate 11 are impurity regions formed using a logic process, and may have the substantially same characteristics as those of logic wells of a logic device. For example, the first and second logic wells 12 and 13 may be any one of a low voltage (LV) logic well, a middle voltage (MV) logic well, and a high voltage (HV) logic well, which are provided in the logic device.

The first logic well 12 and the second logic well 13 may have the substantially same operating voltage or different operating voltages. In a case in which the first and second logic wells 12 and 13 are provided with logic wells having different operating voltages, the first logic well 12 including the drain region 15 may have an operating voltage lower than that of the second logic well 13 in order to improve the erase operation characteristic of the CJH cell. This is because the first logic well 12 acts as an expanded drain during an erase operation. For example, when the first logic well 12 is an LV logic well, the second logic well 13 may be an MV logic well or an HV logic well.

The first and second logic wells 12 and 13 may contact each other under the floating gate 18. A position of an interface at which the first and second logic wells 12 and 13 contact each other may be adjusted depending on characteristics required by the CJH cell. Specifically, as the interface at which the first and second logic wells 12 and 13 contact each other is closer to the source region 16, the critical dimension (CD) of the tunneling region increases to improve program operation and erase operation characteristics of the CJH cell. On the other hand, as the interface at which the first and second logic wells 12 and 13 contact each other is closer to the drain region 15, the critical dimension of the channel region increase to improve a leakage current characteristic and a read operation characteristic of the CJH cell.

The gate dielectric layer 17 includes a first gate dielectric layer 17A on the first logic well 12 and a second gate dielectric layer 17B on the second logic well 13. The thickness of the first gate dielectric layer 17A may be substantially equal to that of the second gate dielectric layer 17B (see FIG. 1B). The thickness of the second gate dielectric layer 17B may be larger than that of the first gate dielectric layer 17A (see FIG. 1C).

The gate dielectric layer 17 is formed using a logic process and may be the same as the gate dielectric layer 17 of the logic device. For example, the gate dielectric layer 17 may be any one of an LV gate dielectric layer, an MV gate dielectric layer, and an HV gate dielectric layer which are provided in the logic gate.

In a case in which the first and second gate dielectric layers 17A and 17B have the substantially same thickness, the gate dielectric layer 17 may be any one of an LV gate dielectric layer, an MV gate dielectric layer, and an HV dielectric layer which are provided in the logic device, and the thickness of the gate dielectric layer 17 in the channel region may be so large that the threshold voltage of the erased CJH cell can be controlled to 0 V or higher. Since the thickness of the gate dielectric layer 17 is adjusted to control the threshold voltage of the erased CJH cell to 0 V or higher, it is unnecessary to provide a selection unit, for example, a select transistor, which selects any one of a plurality of CJH cells. Also, it is unnecessary to perform an additional ion implantation process on the channel region in order to adjust a threshold voltage.

In a case in which the thickness of the first gate dielectric layer 17A is different from that of the second gate dielectric layer 17B, specifically, in a case in which the thickness of the second gate dielectric layer 17B is larger than that of the first gate dielectric layer 17A, the first gate dielectric layer 17A may be an LV gate dielectric layer provided in the logic device, and the second gate dielectric layer 17B may be an MV or HV gate dielectric layer provided in the logic device.

Also, in a case in which the thickness of the second gate dielectric layer 17B is larger than that of the first gate dielectric layer 17A, the first gate dielectric layer 17A may be an oxide layer formed by a thermal oxidation process. The second gate dielectric layer 17B may be a thermal oxide/low temperature oxide stack layer in which thermal oxide layer identical to the first gate dielectric layer 17A and a low temperature oxide layer formed by a low temperature chemical vapor deposition (LTCVD) process are stacked. This is done for preventing the characteristic of the logic device from being degraded by a thermal burden applied to the logic device during the process of forming the second gate dielectric layer 17B having a relatively large thickness.

In addition, in a case in which the thickness of the second gate dielectric layer 17B is larger than that of the first gate dielectric layer 17A, the thickness of the second gate dielectric layer 17B may be so large that the threshold voltage of the erased CJH cell can be controlled to 0 V or higher. As described above, this is done for eliminating the selection unit which selects any one of the plurality of CJH cells and omitting the ion implantation process which controls the threshold voltage in the channel region.

The gate dielectric layer 17 including the first and second gate dielectric layers 17A and 17B with the same thickness can simplify the fabricating process. On the other hand, the gate dielectric layer 17 including the first and second gate dielectric layers 17A and 17B with different thickness can provide optimized thickness to the tunneling region and the channel region. Thus, the characteristics of the program operation, the erase operation and the read operation can be improved, and an error caused by over-erase can be effectively prevented.

The gate dielectric layer 17 including the first and second gate dielectric layers 17A and 17B may be formed by a single gate oxidation process, a dual gate oxidation process, or a triple gate oxidation process of the logic process.

The drain region 15 and the source region 16 may have a lightly doped drain (LDD) structure including heavily doped regions 15A and 16A and lightly doped regions 15B and 16B. Also, in some cases, the drain region 15 and the source region 16 may include only the heavily doped regions 15A and 16A.

The CJH cell may include either or both of the drain region 15 and the source region 16.

In the capacitor 102 coupled to the floating gate 18, the top electrode 22 acts as a control gate for the floating gate 18. The bottom electrode 20 and the top electrode 22 may include a metallic layer or a polysilicon layer. That is, the capacitor 102 may have a metal-insulator-metal (MIM) structure or a polysilicon-insulator-polysilicon (PIP) structure.

The capacitor 102 serves to reduce the size of the CJH cell and effectively transfer a voltage applied to the control gate, that is, the top electrode 22, to the floating gate 18. That is, the capacitor 102 serves to increase the coupling ratio of the CJH cell. To this end, the capacitor 102 may have a capacitance as large as possible within a limited area.

In order for the capacitor 102 to have a capacitance as large as possible within a limited area, the dielectric layer 21 is formed of a material having a high dielectric constant. In order to increase the capacitance of the capacitor 102, the dielectric layer 21 may include a single layer having a high dielectric constant or a stack layer in which materials having two or more dielectric constants are stacked. The material having the high dielectric constant refers to a material having a dielectric constant larger than that of a silicon oxide layer formed by a thermal oxidation process.

Also, in order to apply the dielectric layer 21 having the high dielectric constant and improve the capacitance of the capacitor 102, the capacitor 102 may have a 3D structure having a concave shape, a convex shape, a cylindrical shape, or a pillar shape, as well as a flat plate shape illustrated in the drawings. When the capacitor 102 has a 3D structure, a contact area between the bottom electrode 20 and the dielectric layer 21 and a contact area between the top electrode 22 and the dielectric layer 21 can increase. Thus, the capacitance of the capacitor 102 within the limited area can increase.

Hereinafter, the influence of the capacitance of the capacitor 102 on the coupling ratio of the CJH cell will be described below in detail with reference to FIG. 2.

In FIG. 2, "$C_{MIM}$" represents the capacitance of the MIM capacitor 102, "$C_{tu}$" represents the capacitance component of the tunneling region, and "$C_{ch}$" represents the capacitance component of the channel region.

Referring to FIG. 2, when a program voltage ($V_{PGM}$) is applied to the word line 28, a voltage ($V_{FG}$) transferred to the floating gate 20 may be expressed as Equation 1 below.

$$V_{FG} = \frac{C_{MIM}}{C_{MIM} + C_{tu} + C_{ch}} V_{PGM} \qquad \text{Eq. 1}$$

When an erase voltage ($V_{ERS}$) is applied to the bit line 27, a voltage ($V_{FG}$) transferred to the floating gate 20 may be expressed as Equation 2 below.

$$V_{FG} = \frac{C_{OX}}{C_{MIM} + C_{tu} + C_{ch}} V_{ERS} \qquad \text{Eq. 2}$$

where "$C_{OX}$" represents the capacitance component in the region where the floating gate 18, the gate dielectric layer 17, the first logic well 12, and the second logic well 13 are overlapped with one another.

It can be seen from Equations 1 and 2 that as the capacitance of the capacitor 102 increases, the magnitude of the voltage applied to the floating gate 18 increases. Therefore, the capacitance can be maximally increased within the limited area by controlling the material, stack structure, and thickness of the dielectric layer 21 and the shape of the capacitor 102 in the CJH cell.

A method for operating the CJH cell will be described below in detail with reference to FIGS. 1A to 1C.

In the operation of selecting any one of the plurality of CJH cells, when a positive voltage is applied to the word line 28 and the bit line 27, a channel is formed in the channel region of the CJH cell, and the first logic well 12 acts as an expanded drain. In this manner, a specific CJH cell can be selected.

In the program operation, a program voltage is applied to the word line 28 coupled to the control gate, that is, the top electrode 22 of the capacitor 102, and a ground voltage (e.g., 0 V) is applied to the bit line 27 coupled to the drain region 15. At this time, the source line 29 coupled to the source region 16 is floated in order to improve the program operation characteristic of the CJH cell. As the source line 29 is floated, the second logic well 13 is also floated. As such, when the voltages are applied to the word line 28, the bit line 27, and the source line 29, the electrons are injected into the floating gate 18 in the tunneling region of the CJH cell by F-N tunneling, and the CJH cell is programmed. When the CJH cell is programmed, the threshold voltage of the channel region is increased.

In the erase operation, an erase voltage is applied to the bit line 27, and a ground voltage is applied to the word line 28. At this time, in order to improve the erase operation characteristic of the CJH cell, the source line 29 is floated. As the source line 29 is floated, the second logic well 13 is also floated. As such, when the voltages are applied to the word line 28, the bit line 27, and the source line 29, the electrons are discharged from the floating gate 18 in the tunneling region of the CJH cell by F-N tunneling, and the CJH cell is erased. When the CJH cell is erased, the threshold voltage of the channel region is decreased.

The logic device has no logic junction which can endure a high voltage such as the erase voltage. However, in the CJH cell formed using the logic process in accordance with the embodiment of the present invention, the first logic well 12 including the drain region 15 acts as the expanded drain and thus the CJH cell can endure the erase voltage applied to the bit line 27 during the erase operation.

In the read operation, a read voltage having a voltage level between the threshold voltage level of the programmed CJH cell and the threshold voltage level of the erased CJH cell is applied to the word line 28, and a positive voltage is applied to the bit line 27. A ground voltage is applied to the source line 29. As the ground voltage is applied to the source line 29, the second logic well 13 has a state in which the ground voltage is applied. As such, when the voltages are applied to the word line 28, the bit line 27, and the source line 29, F-N tunneling does not occur in the tunneling region. When the CJH cell is programmed, no channel is formed in the channel region. When the CJH cell is erased, the channel is formed in the channel region. In this manner, data stored in the CJH cell can be read.

In the operation of the CJH cell, the magnitude of the erase voltage may be smaller than the breakdown voltage between the first logic well 12 and the second logic well 13.

The breakdown voltage of the capacitor 102 may be greater than a voltage obtained by a product of a voltage necessary for the program operation and the erase operation of the CJH cell and "1—the coupling ratio". This is because endurance and retention characteristics of the CJH cell can be stably ensured when the breakdown voltage of the capacitor 102 is higher than the product of the program voltage (erase voltage) and "1—the coupling ratio". Therefore, the material, stack structure, and thickness of the dielectric layer 21 and the shape of the capacitor 102 are controlled so that the capacitor of the CJH cell can have the maximum capacitance within the limited area and can endure the program voltage and the erase voltage.

As described above, the nonvolatile memory device, that is, the CJH cell, in accordance with the first embodiment of the present invention performs the program operation, the erase operation, the read operation, and the select operation through the simple 1T+1C structure. Hence, the CJH cell can be easily applied to the SoC.

Also, since the CJH cell in accordance with the embodiment of the present invention has the 1T+1C structure, the cell size can be remarkably reduced as compared to the conventional single gate type MTP. When the logic process having the minimum critical dimension of 0.18 μm is used, the unit cell of the CJH cell has an area of 3.5 μm², and the unit cell of the virage MTP has an area of 14.87 μm², which is more than 4.5 times larger than the CJH cell.

In addition, since the CJH cell in accordance with the embodiment of the present invention is formed using the logic process, the embedded technology of the nonvolatile memory device is possible. Thus, the nonvolatile memory device can be integrated into the SoC at a low cost in any type of technologies in which the logic process is used as a backbone.

Furthermore, compared with the conventional stack gate type nonvolatile memory device, the fabrication process can be greatly simplified, and it is unnecessary to consider the degradation of the reliability derived from a complicated fabrication process.

Moreover, compared with the conventional single gate type nonvolatile memory device, the high integration can be achieved. Thus, in designing the SoC, products having new additional features can be variously designed.

Various modifications of the above-described CJH cell will be described in detail. For convenience of explanation, like elements are used to refer to like elements, and the following description will be focused on the difference from the CJH cell in accordance with the first embodiment of the present invention.

Figure 3B:
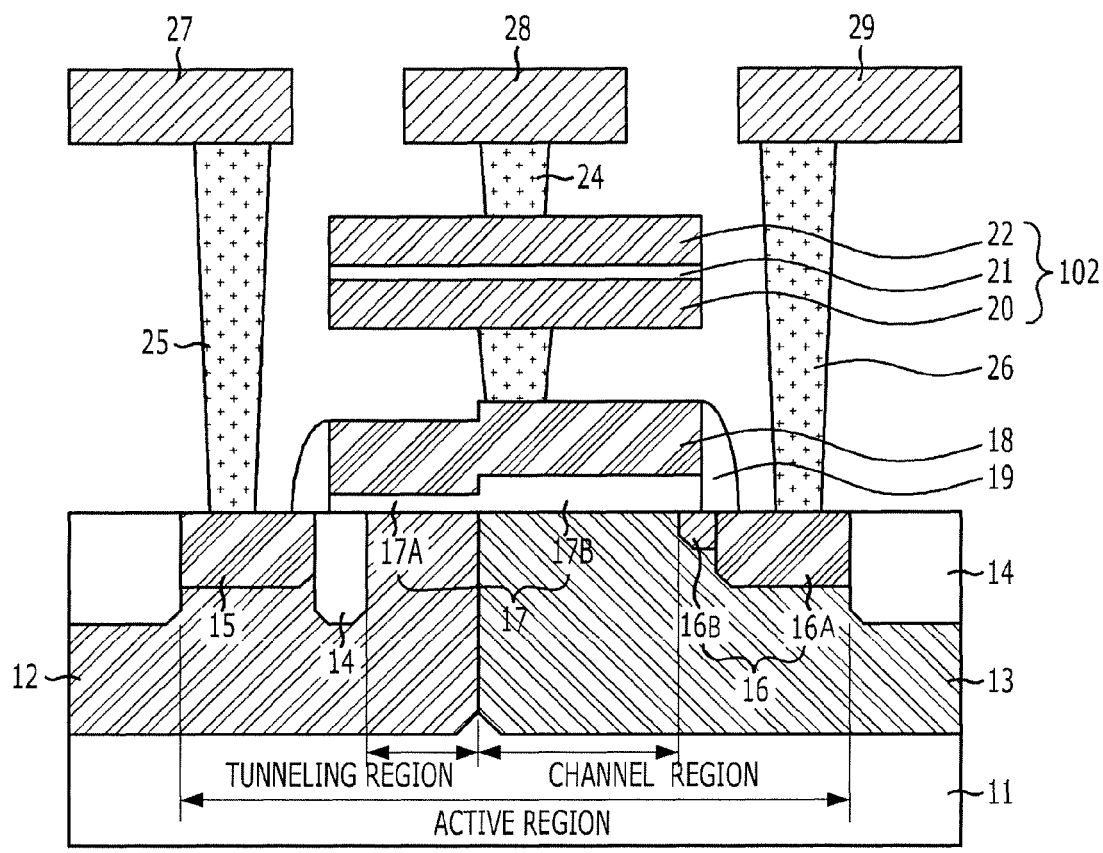

FIGS. 3A and 3B are cross-sectional views of a nonvolatile memory device in accordance with a second embodiment of the present invention.

Referring to FIGS. 3A and 3B, a CJH cell in accordance with a second embodiment of the present invention is characterized in that an isolation layer 14 is disposed under a floating gate 18 adjacent to a drain region 15. Due to the isolation layer 14 disposed under the floating gate 18, the drain region 15 and the floating gate 18 are spaced apart from each other by a predetermined interval. Thus, compared with the first embodiment of the present invention, the CJH cell in accordance with the second embodiment of the present invention can control a higher driving voltage (program voltage and erase voltage) and can more effectively endure the high erase voltage.

Figure 4A:
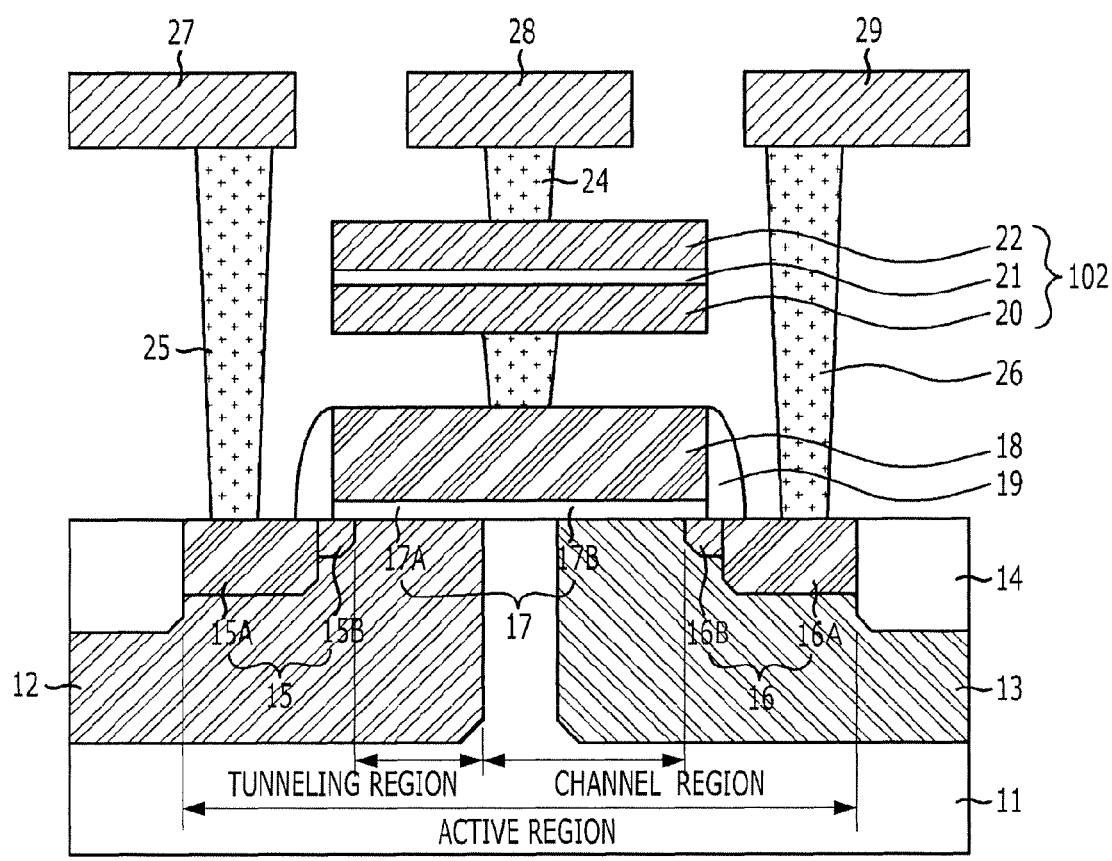
FIGS. 4A and 4B are cross-sectional views of a nonvolatile memory device in accordance with a third embodiment of the present invention.
Figure 4B:
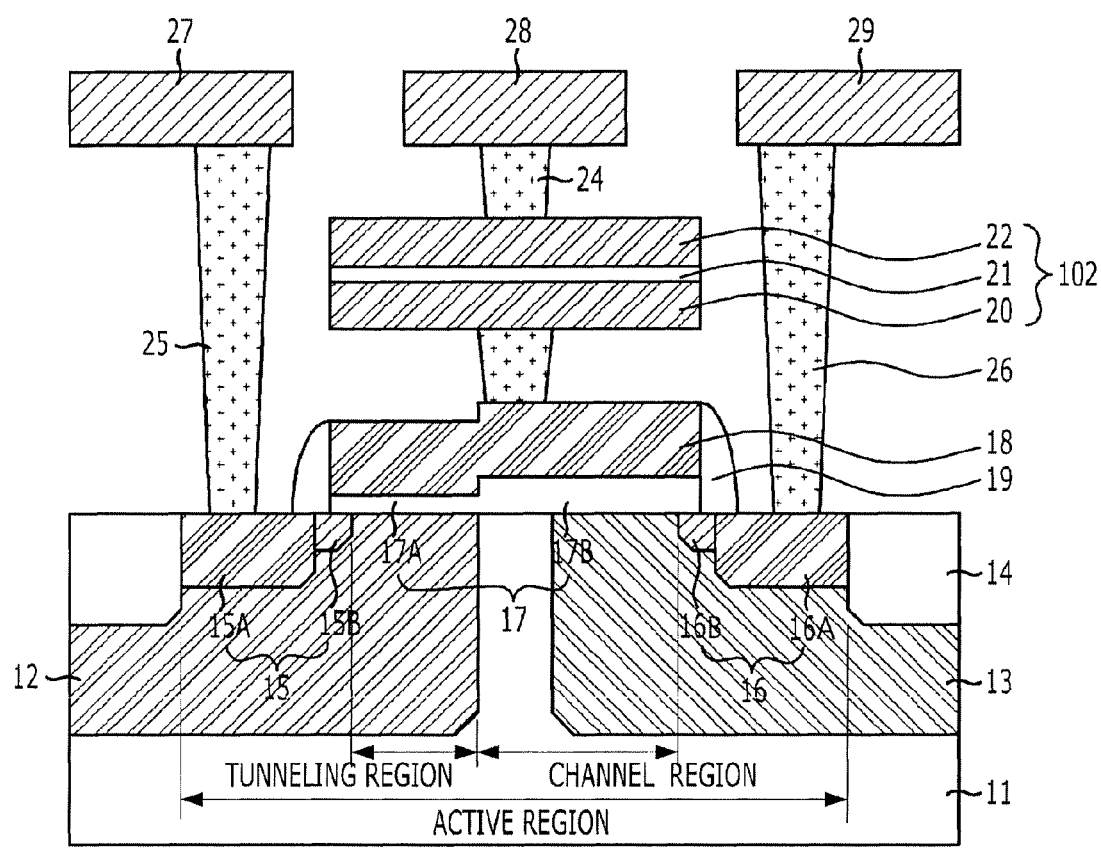

FIGS. 4A and 4B are cross-sectional views of a nonvolatile memory device in accordance with a third embodiment of the present invention.

Referring to FIGS. 4A and 4B, a CJH cell in accordance with a third embodiment of the present invention is characterized in that a first logic well 12 and a second logic well 13 under a floating gate 18 are spaced apart from each other by a predetermined interval. Therefore, the floating gate 18 may have a structure in which the first logic well 12, a substrate 11 of a first conductivity type, and the second logic well 13 are overlapped in a direction from a drain region 15 to a source region 16.

Since the first logic well 12 and the second logic well 13 of the CJH cell in accordance with the first embodiment of the present invention are formed using the logic process, it is difficult to adjust the impurity doping concentrations of the first logic well 12 and the second logic well 13. Hence, there is a limitation in improving the breakdown voltage characteristic between the first logic well 12 and the second logic well 13 to more than an appropriate level.

However, in the CJH cell in accordance with the third embodiment of the present invention, the first logic well 12 and the second logic well 13 are spaced apart from each other by a predetermined interval. Thus, the breakdown voltage characteristic between the first logic well 12 and the second logic well 13 can be more effectively improved, as compared to the CJH cell in accordance with the first embodiment of the present invention. AS the interval between the first logic well 12 and the second logic well 13 increases, the breakdown voltage between the first logic well 12 and the second logic well 13 further increases. The substrate 11 of the first conductivity type has an impurity doping concentration lower than those of the first and second logic wells 12 and 13.

As such, as the breakdown voltage between the first logic well 12 and the second logic well 13 increases, it is possible to prevent the problem that the voltage applied to the word line 28 is not sufficiently transferred to the CJH cell. That is, when the breakdown voltage between the first logic well 12 and the second logic well 13 increases, higher program voltage/erase voltage can be used. Therefore, the program/erase efficiency can be improved.

Figure 5A:
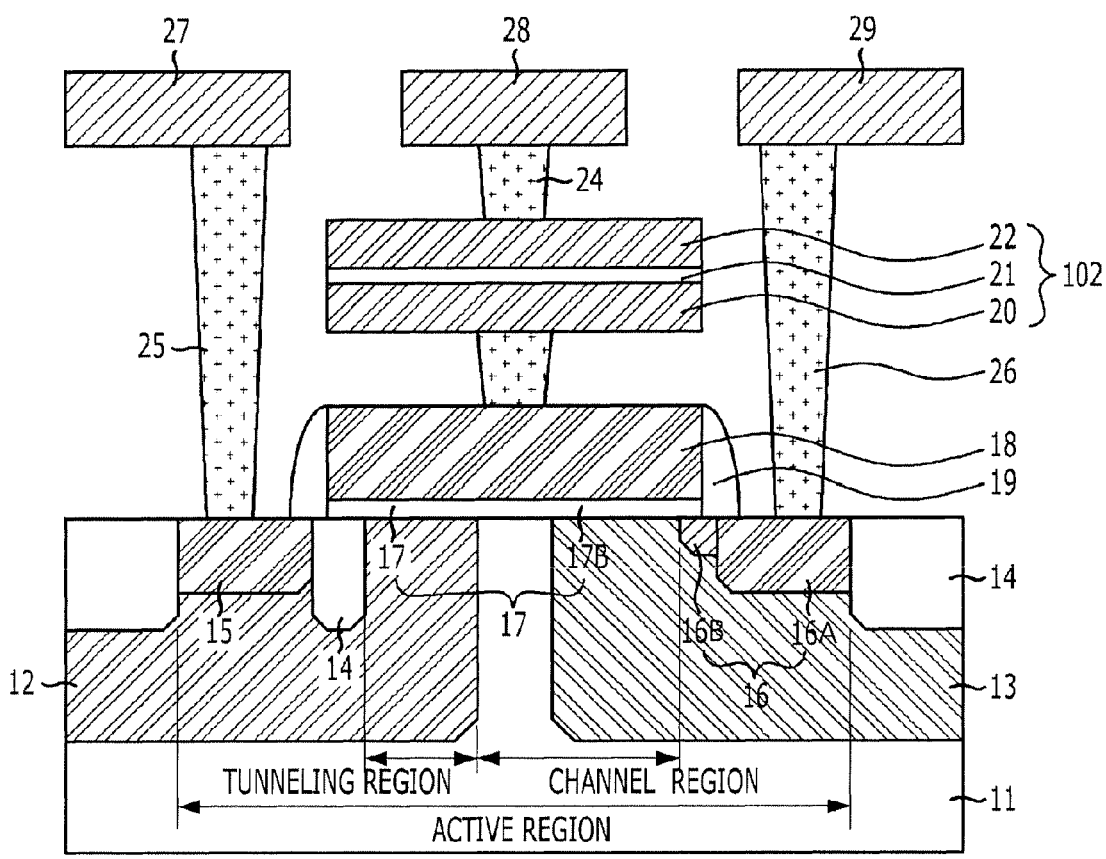
FIGS. 5A and 5B are cross-sectional views of a nonvolatile memory device in accordance with a fourth embodiment of the present invention.
Figure 5B:
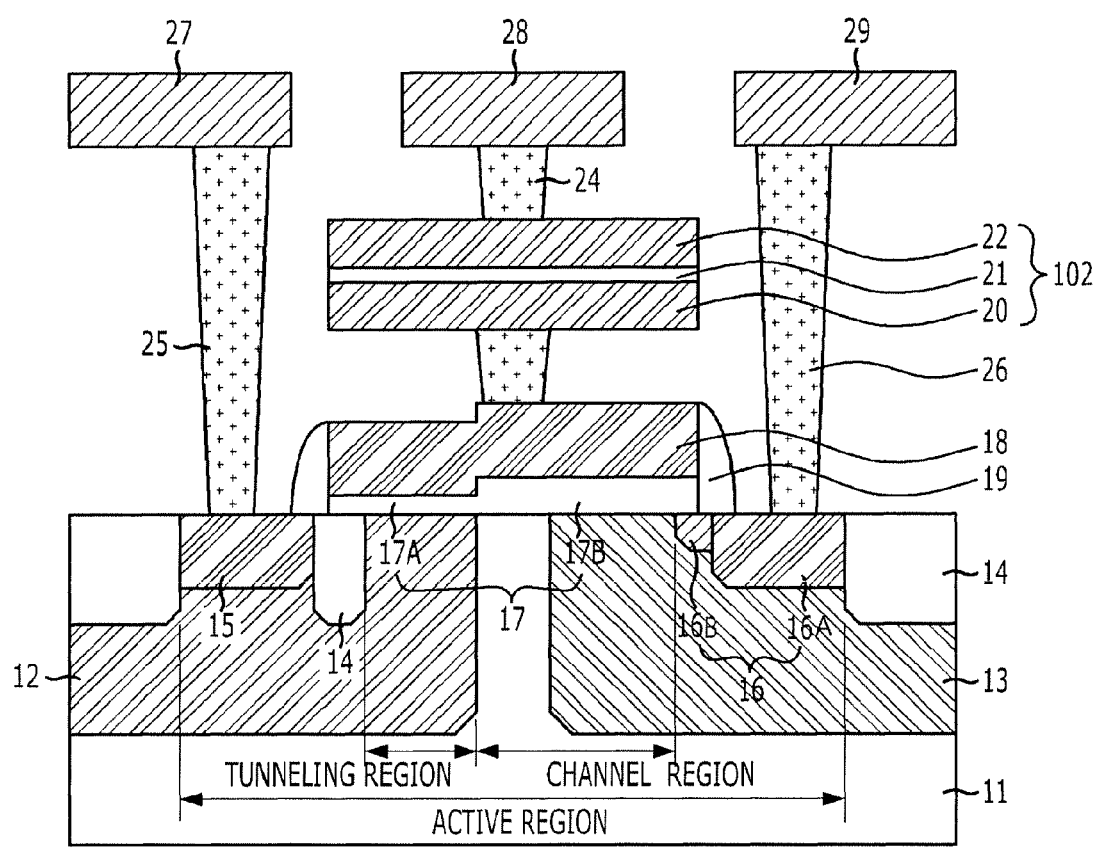

FIGS. 5A and 5B are cross-sectional views of a nonvolatile memory device in accordance with a fourth embodiment of the present invention.

Referring to FIGS. 5A and 5B, a CJH cell in accordance with a fourth embodiment of the present invention is characterized in that an isolation layer 14 is disposed under a floating gate 18 adjacent to a drain region 15, and a first logic well 12 and a second logic well 13 under the floating gate 18 are spaced apart from each other by a predetermined interval. Therefore, the floating gate 18 may have a structure in which the isolation layer 14, the first logic well 12, a substrate 11 of a first conductivity type, and the second logic well 13 are overlapped with one another.

Compared with the first embodiment of the present invention, the CJH cell in accordance with the fourth embodiment of the present invention can control a higher driving voltage and can more effectively endure the erase voltage. Furthermore, compared with the first embodiment of the present invention, the CJH cell in accordance with the fourth embodiment of the present invention can more effectively improve the breakdown voltage characteristic between the first logic well 12 and the second logic well 13.

Figure 6A:
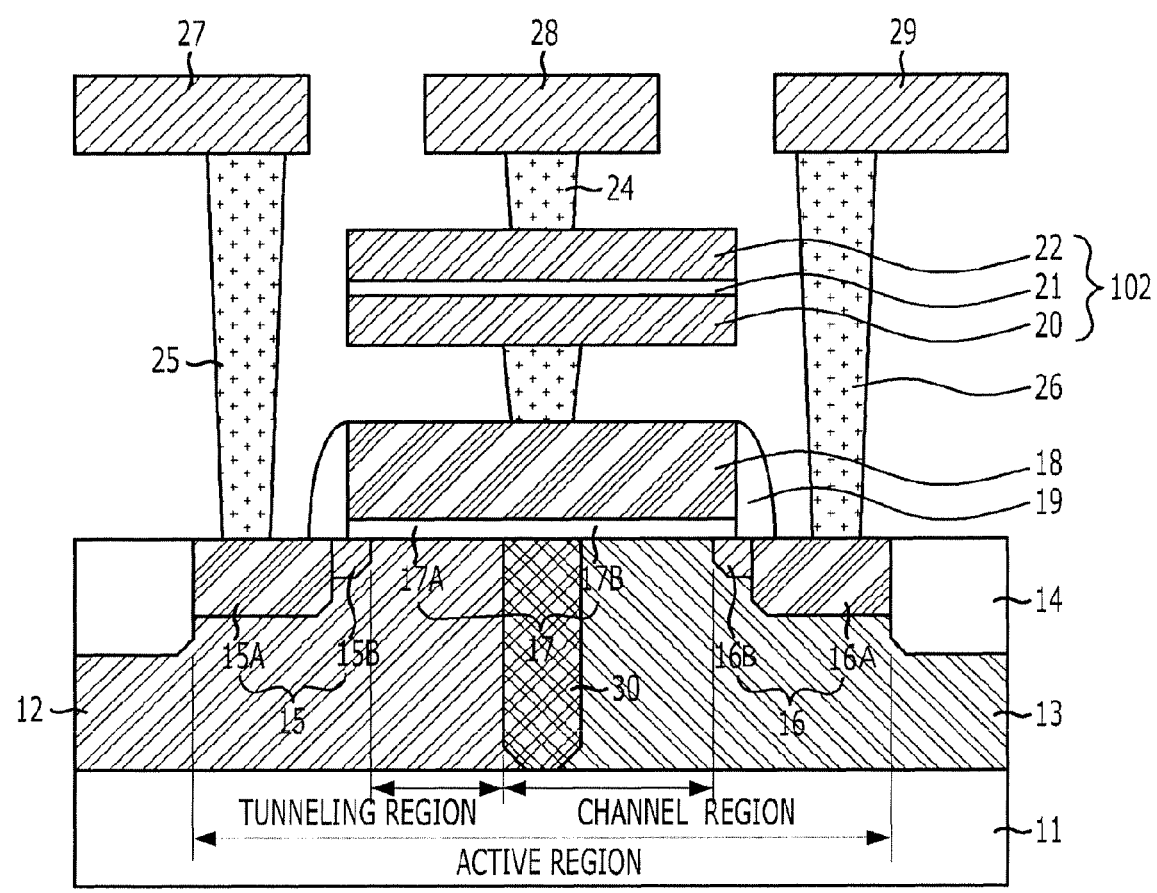
FIGS. 6A and 6B are cross-sectional views of a nonvolatile memory device in accordance with a fifth embodiment of the present invention.
Figure 6B:
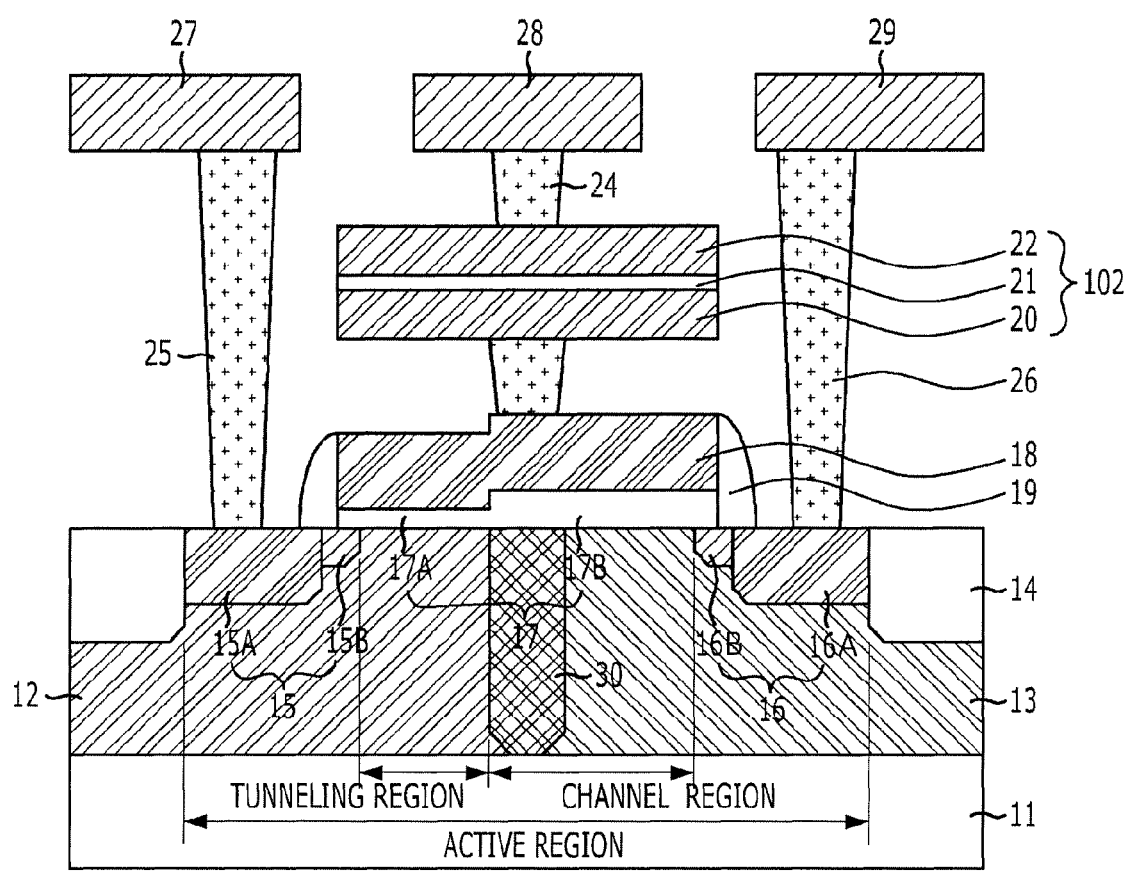

FIGS. 6A and 6B are cross-sectional views of a nonvolatile memory device in accordance with a fifth embodiment of the present invention.

Referring to FIGS. 6A and 6B, a CJH cell in accordance with a fifth embodiment of the present invention is characterized in that it includes an overlap region 30 in which a first logic well 12 and a second logic well 13 are partially overlapped under a floating gate 18. The overlap region 30 may have a neutral conductivity type due to the overlap of the first and second logic wells 12 and 13 having different conductivity types, or may have the first conductivity type with an impurity doping concentration lower than those of the first and second logic wells 12 and 13.

Since the CJH cell in accordance with the fifth embodiment of the present invention has the overlap region 30 in which the first logic well 12 and the second logic well 13 are overlapped with each other, the breakdown voltage characteristic between the first logic well 12 and the second logic well 13 can be more effectively improved, as compared to the CJH cell in accordance with the first embodiment of the present invention. As the critical dimension of the overlap region 30 increases, the breakdown voltage between the first logic well 12 and the second logic well 13 is further increased.

Figure 7A:
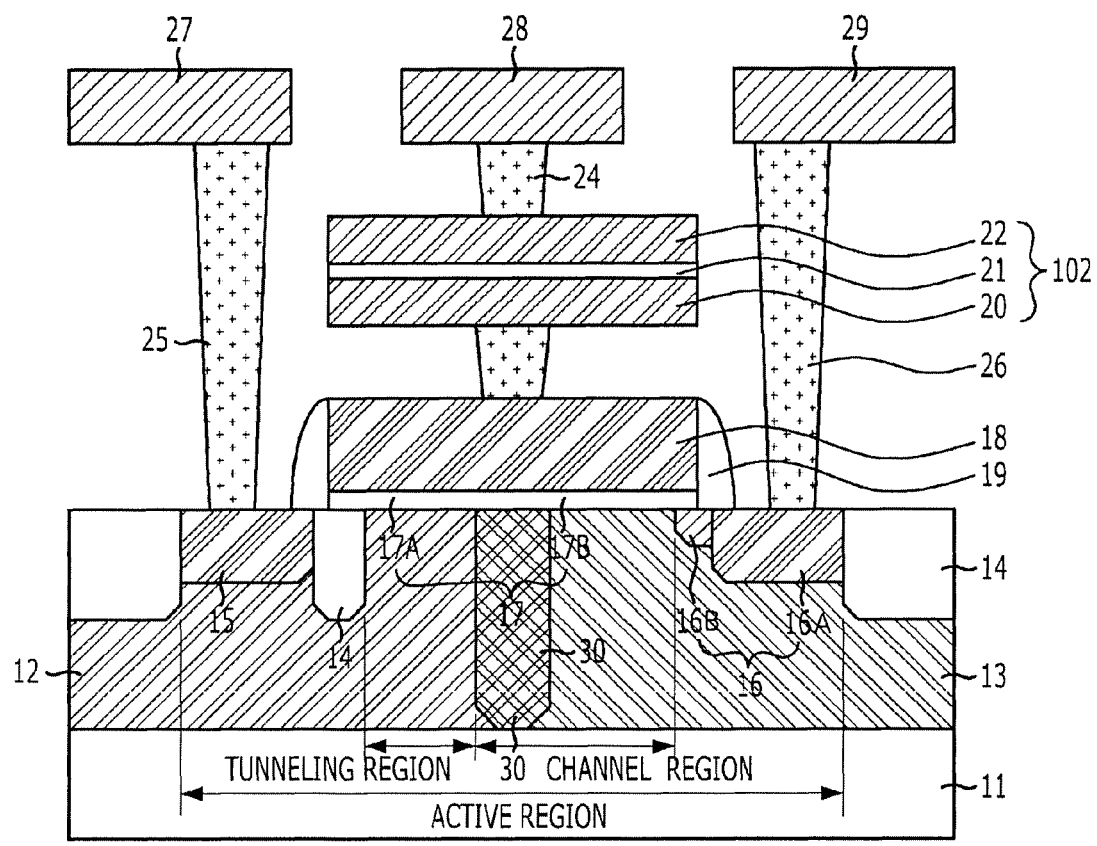
FIGS. 7A and 7B are cross-sectional views of a nonvolatile memory device in accordance with a sixth embodiment of the present invention.
Figure 7B:
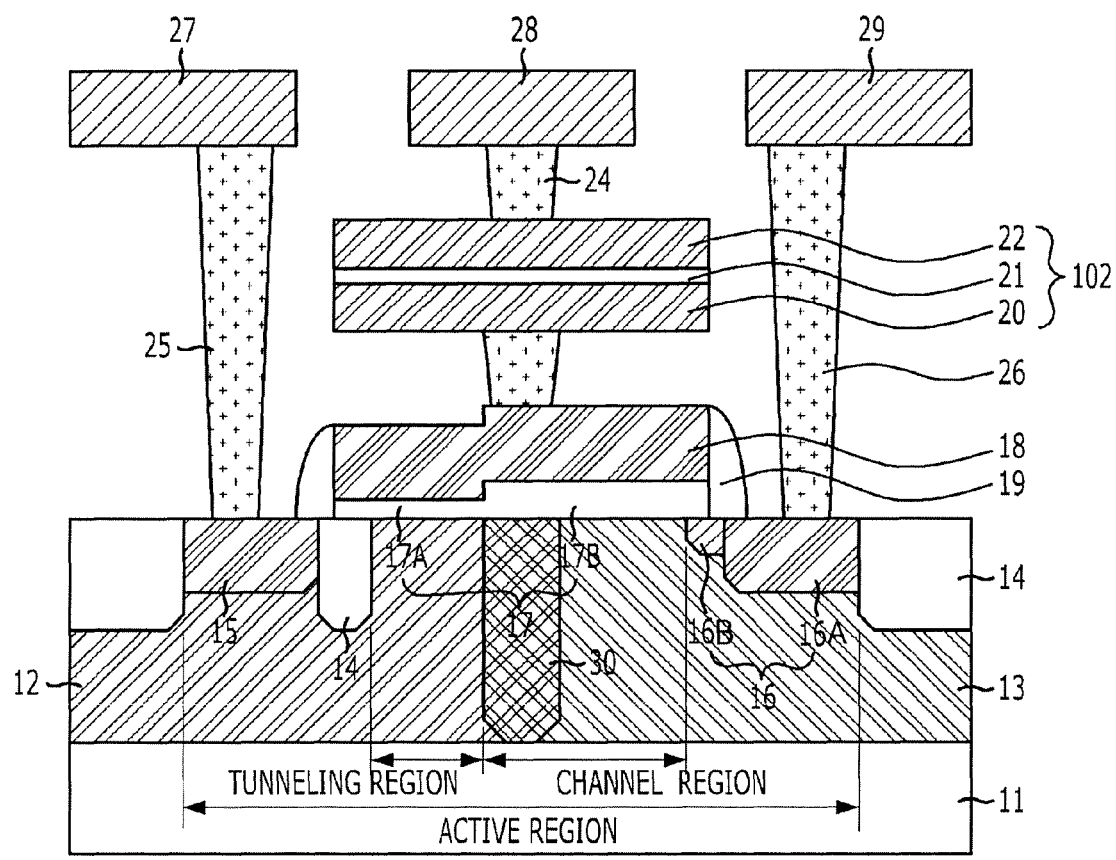

FIGS. 7A and 7B are cross-sectional views of a nonvolatile memory device in accordance with a sixth embodiment of the present invention.

Referring to FIGS. 7A and 7B, a CJH cell in accordance with a sixth embodiment of the present invention is characterized in that an isolation layer 14 is disposed under a floating gate 18 adjacent to a drain region 15, and the CJH cell has an overlap region 30 in which a first logic well 12 and a second logic well 13 are partially overlapped under the floating gate 18. Therefore, the floating gate 18 may have a structure in which the isolation layer 14, the first logic well 12, the overlap region 30, and the second logic well 13 are overlapped with one another in a direction from the drain region 15 to a source region 16.

Compared with the first embodiment of the present invention, the CJH cell in accordance with the second embodiment of the present invention can control a higher driving voltage and more effectively endure an erase voltage. In addition, the breakdown voltage characteristic between the first logic well 12 and the second logic well 13 can be more effectively improved than the CJH cell in accordance with the first embodiment of the present invention.

Using the above-described CJH, the SoC may include a driving unit which controls a driving of the CJH cell. The driving unit may include a transistor fabricated using a logic process, for example, an NMOS transistor, a PMOS transistor, or a CMOS transistor in which an NMOS transistor and a PMOS transistor are coupled to each other. An NMOS transistor will be exemplarily described as a driving transistor applicable to the driving unit which controls the driving of the CJH cell in accordance with the embodiment of the present invention. Therefore, in the following description, the first conductivity type is a P type and the second conductivity type is an N type. The features of the NMOS transistor, which are to be described, can be selectively applied to the PMOS transistor and the CMOS transistor.

Figure 8A:
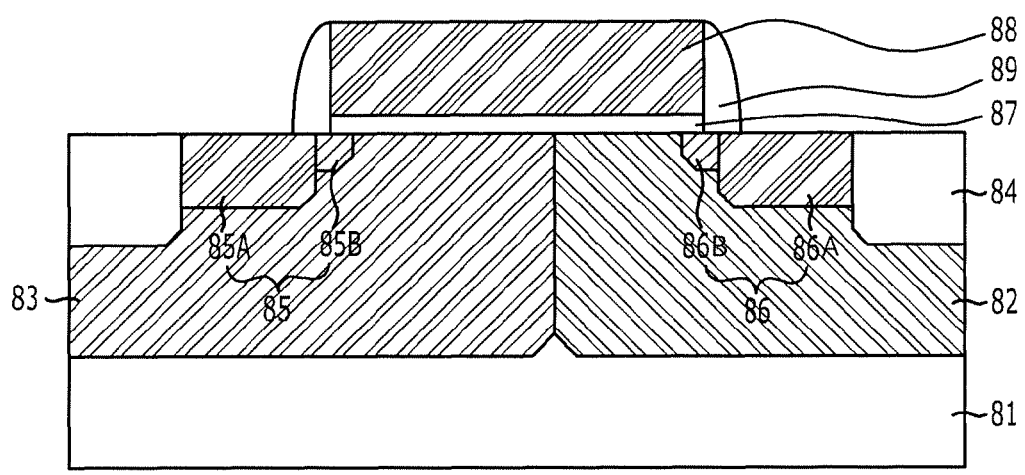
FIGS. 8A-8E are cross-sectional views of a driving transistor in accordance with an embodiment of the present invention.
Figure 8B:
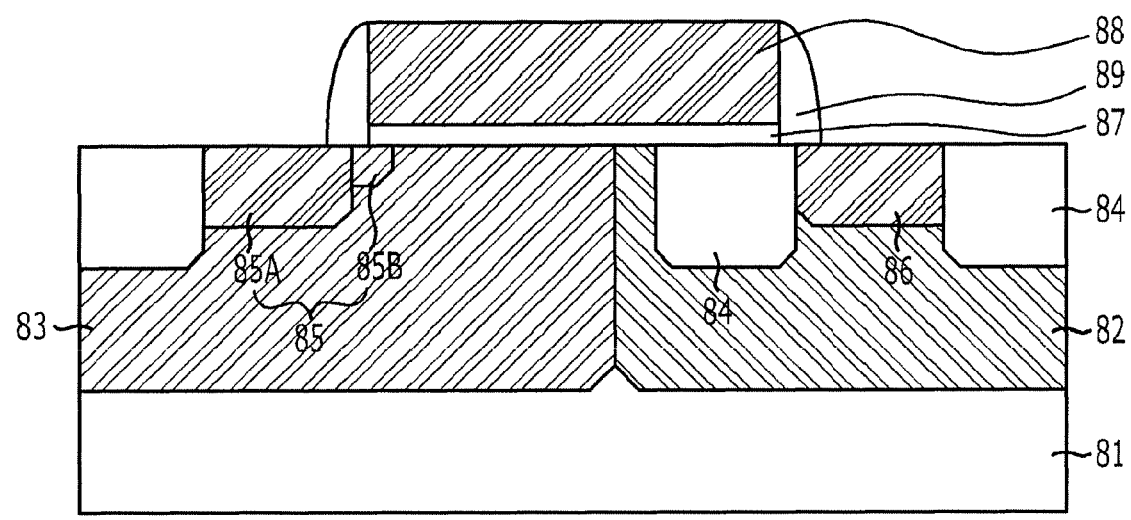

FIGS. 8A and 8B are cross-sectional views of a driving transistor in accordance with an embodiment of the present invention. Like reference numerals are used to refer to like elements throughout the drawings, and duplicate description about the same elements will be omitted. The driving transistor illustrated in FIG. 8A is used as a basic type.

Referring to FIG. 8A, the driving transistor in accordance with the embodiment of the present invention includes an N-type logic well 82 and a P-type logic well 83 on a P-type substrate 81. Also, an isolation layer 84 is disposed on the substrate 81 to define an active region. A gate electrode 88 is disposed on the substrate 81 and crosses both the N-type logic well 82 and the P-type logic well 83. A gate dielectric layer 87 is disposed between the substrate 81 and the gate electrode 88. Spacers 89 are disposed on both sides of the gate electrode 88 and the gate dielectric layer 87. An N-type drain region 86 is disposed in the N-type logic well 82 on one side of the gate electrode 87. An N-type source region 85 is disposed in the P-type logic well 83 on the other side of the gate electrode 88.

Like the first and second logic wells of the CJH cell, the N-type logic well 82 and the P-type logic well 83 are formed using a logic process and may be the same as the logic wells of the logic device.

The gate electrode 88 is formed using a logic process and may include the same material as the floating gate of the CJH cell, for example, polysilicon. That is, the gate electrode 88 may be formed during the process of forming the floating gate of the CJH cell.

The gate dielectric layer 87 is formed using a logic process and may include the same material as the gate dielectric layer of the CJH cell, for example, a thermal oxide layer or a stack layer in which a thermal oxide layer and a low temperature oxide layer are stacked. That is, the gate dielectric layer 87 may be formed during the process of forming the gate dielectric layer of the CJH cell.

The N-type drain region 86 and the N-type source region 85 may have an LDD structure including heavily doped regions 85A and 86A and lightly doped regions 85B and 86B. Also, the N-type drain region 86 and the N-type source region 85 may include only the heavily doped regions 85A and 86A. The N-type drain region 86 and the N-type source region 85 are formed using a logic process and may be formed during the process of forming the drain region and the source region of the CJH cell.

Referring to FIG. 8B, the driving transistor in accordance with the embodiment of the present invention includes an isolation layer 84 which is disposed in the N-type logic well 82 and overlapped with one end of the gate electrode 88 to space the gate electrode 88 from the drain region 86 by a predetermined interval.

The isolation layer 84 disposed in the N-type logic well 82 and overlapped with the gate electrode 88 can control a higher driving voltage than that of the basic type transistor.

Figure 8C:
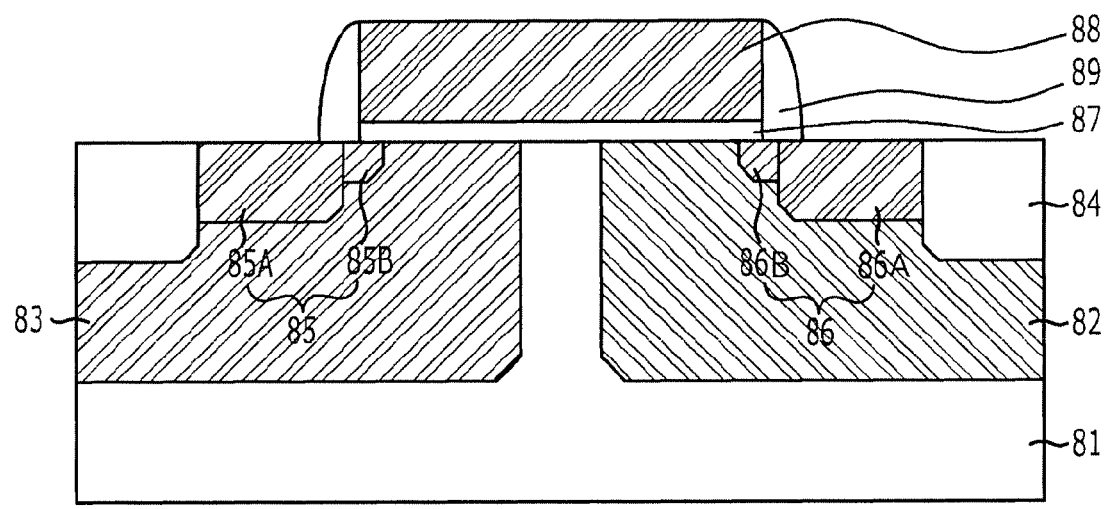

Referring to FIG. 8C, the driving transistor in accordance with the embodiment of the present invention is characterized in that the N-type logic well 82 and the P-type logic well 83 are spaced apart by a predetermined interval under the gate electrode 88. Although not shown, the driving transistor may further include an isolation layer 84 which is formed in the N-type logic well 82 and overlapped with one end of the gate electrode 88, in such a state that the N-type logic well 82 and the P-type logic well 83 are spaced apart.

A case in which the N-type logic well 82 and the P-type logic well 83 are spaced apart by a predetermined interval can further improve the breakdown voltage between the logic wells than a case in which the N-type logic well 82 and the P-type logic well 83 are overlapped under the gate electrode 88. As the breakdown voltage between the logic wells increases, a higher driving voltage can be controlled.

Figure 8D:
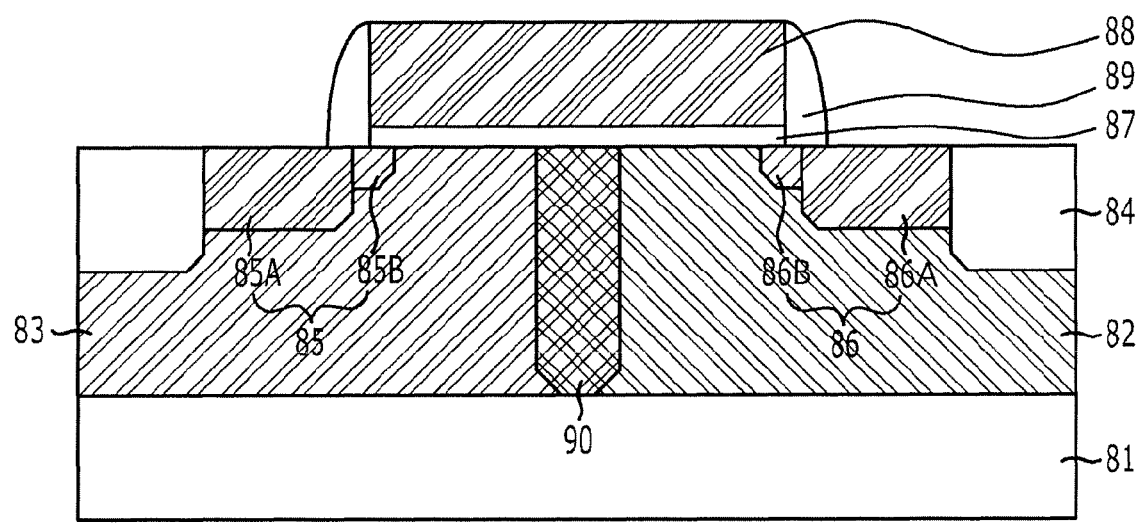

Referring to FIG. 8D, the driving transistor in accordance with the embodiment of the present invention includes an overlap region 92 in which the N-type logic well 82 and the P-type logic well 83 are partially overlapped under the gate electrode 88. Although not shown, the driving transistor may further include an isolation layer 84 which is formed in the N-type logic well 82 and overlapped with one end of the gate electrode 88, in such a state that the N-type logic well 82 and the P-type logic well 83 are overlapped with each other.

Like the case in which the N-type logic well 82 and the P-type logic well 83 are spaced apart by a predetermined interval, the case in which the driving transistor has the overlap region 92 in which the N-type logic well 82 and the P-type logic well 83 are partially overlapped can increase the breakdown voltage between the logic wells.

Figure 8E:
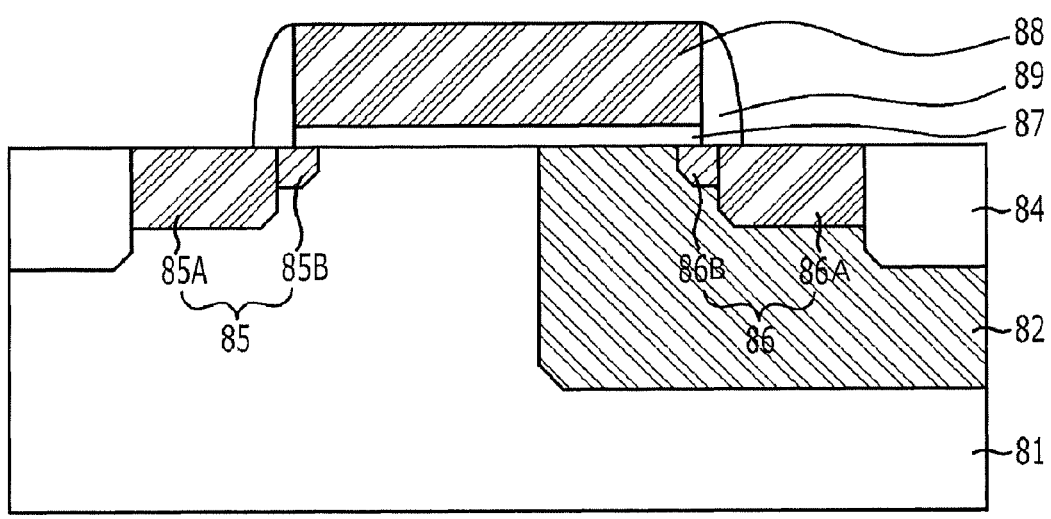

Referring to FIG. 8E, the driving transistor in accordance with the embodiment of the present invention is characterized in that the P-type logic well 83 is replaced with the P-type substrate 81 in the basic type. Although not shown, the driving transistor may further include an isolation layer 84 which is formed in the N-type logic well 82 and overlapped with one end of the gate electrode 88, in such a state that the P-type logic well 83 is replaced with the P-type substrate 81.

Since the impurity doping concentration of the P-type substrate 81 is lower than that of the P-type logic well 83, the driving transistor in which the P-type logic well 83 is replaced with the P-type substrate 81 can further increase the breakdown voltage than the above-described structure.

In addition, since the driving transistor in which the P-type logic well 83 is replaced with the P-type substrate 81 can be formed so that the threshold voltage approaches almost 0 V, it is possible to manufacture a native device which can minimize a voltage transfer loss through the driving transistor.

Meanwhile, although the case in which the transistors illustrated in FIGS. 8A to 8E are applied to the driving transistor for driving the CJH cell have been exemplarily described, they can also be applied to other various technical fields. For example, if the transistors illustrated in FIGS. 8A to 8E are applied when an MV or HV transistor is formed in a logic device configured with an LV transistor, the MV or HV transistor can be easily implemented without additional processes such as a mask process.

FIGS. 9A to 9F are cross-sectional views illustrating a method for fabricating a nonvolatile memory device in accordance with an embodiment of the present invention. In the method for fabricating the nonvolatile memory device in accordance with the embodiment of the present invention, a case in which a gate dielectric layer has a different thickness will be exemplarily described.

Figure 9A:
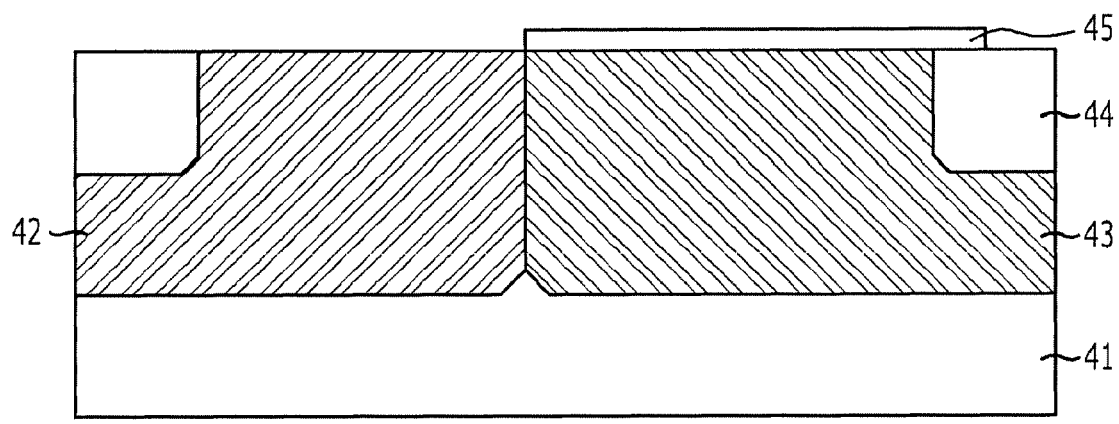
FIGS. 9A to 9F are cross-sectional views illustrating a method for fabricating a nonvolatile memory device in accordance with an embodiment of the present invention.

Referring to FIG. 9A, a substrate 41 is selectively etched to form a trench for device isolation, and the trench is filled with an insulating material to form an isolation layer 44.

Impurity ions are implanted into the substrate 41 of a first conductivity type to form a first logic well 42 of a second conductivity type and a second logic well 43 of the first conductivity type. The first logic well 42 and the second logic well 43 are formed the same as the logic wells provided in the logic device. That is, the first logic well 42 and the second logic well 43 of the nonvolatile memory device are formed using a logic process.

A first insulation layer 45 is formed on the substrate 41 in the second logic well 43. The first insulation layer 45 acts as a gate dielectric layer and has a relatively large thickness. The first insulation layer 45 may include an oxide layer. The first insulation layer 45 may be a low temperature oxide layer formed using an LTCVD process in order to prevent characteristics from being degraded by a thermal burden applied to the logic device.

The first insulation layer 45 formed on the substrate 41 in the second logic well 43 may be formed by depositing a low temperature oxide layer over the substrate 41 by an LTCVD process and sequentially performing a mask process and a wet etching process on the deposited low temperature oxide layer. The mask process for patterning the first insulation layer 45 may be a process added to a logic process.

Figure 9B:
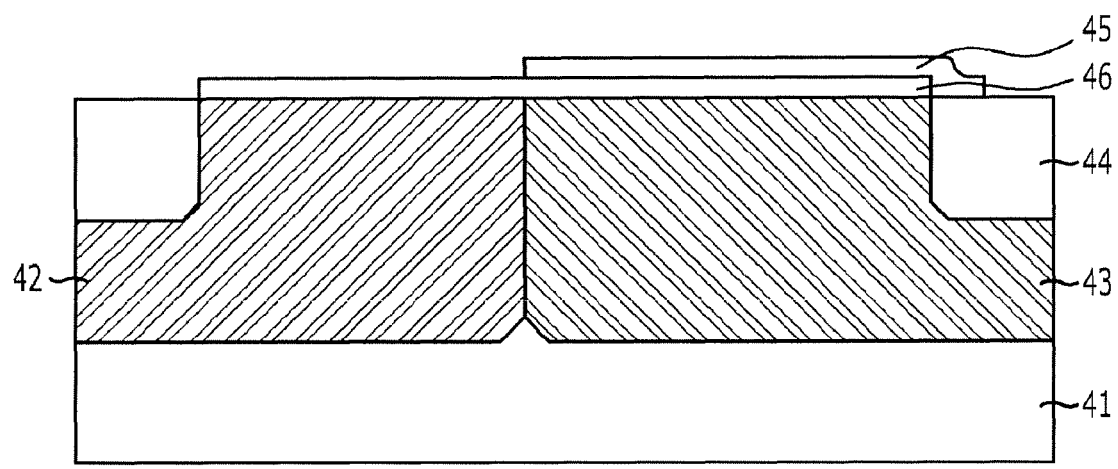

Referring to FIG. 9B, a second insulation layer 46 is formed on the first and second logic wells 42 and 43. The second insulation layer 46 acts as a gate dielectric layer just like the first insulation layer 45. The second insulation layer 46 may be formed by a gate dielectric layer forming process used in the logic process.

The second insulation layer 46 may include an oxide layer and may be formed by a thermal oxidation process. At this time, due to the characteristic of the thermal oxidation process, the second insulation layer 46 is grown from the surface of the substrate 41.

Figure 9C:
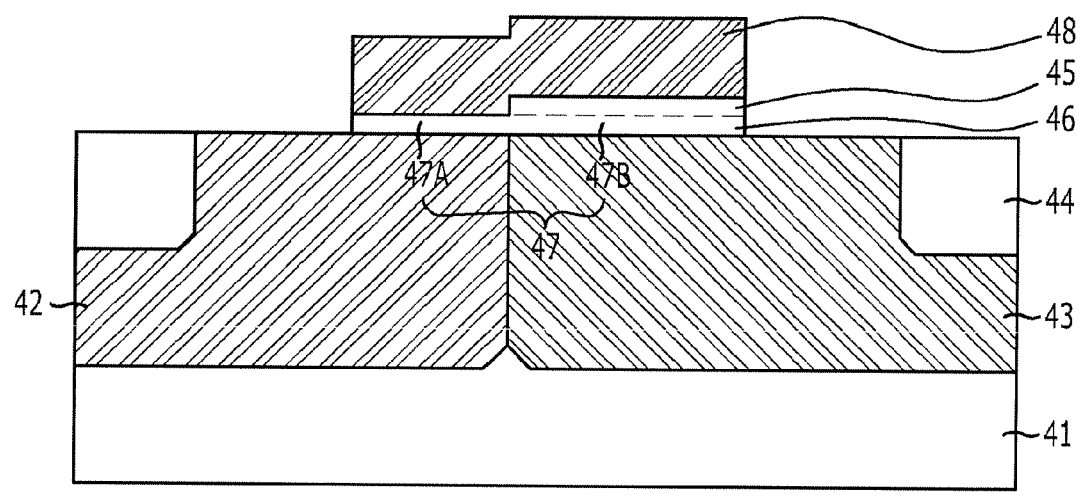

Referring to FIG. 9C, a polysilicon layer is deposited over the substrate 41, including the first insulation layer 45 and the second insulation layer 46. The polysilicon layer and the first and second insulation layers 45 and 46 are sequentially etched to form a floating gate 48 crossing both the first logic well 42 and the second logic well 43.

A gate dielectric layer 47 is formed between the substrate 41 and the floating gate 48 during the process of forming the floating gate 48. In this case, the gate dielectric layer 47 may have a first gate dielectric layer 47A and a second gate dielectric layer 47B. The first gate dielectric layer 47A is formed using the second insulation layer 46. The second gate dielectric layer 47B has a structure in which the second insulation layer 46 and the first insulation layer 45 are stacked, and has a thickness larger than that of the first gate dielectric layer 47A.

In the following description, the boundary between the first gate insulation layer 45 and the second gate insulation layer 46 in the gate dielectric layer 47 is not illustrated for helping understanding the drawing.

Figure 9D:
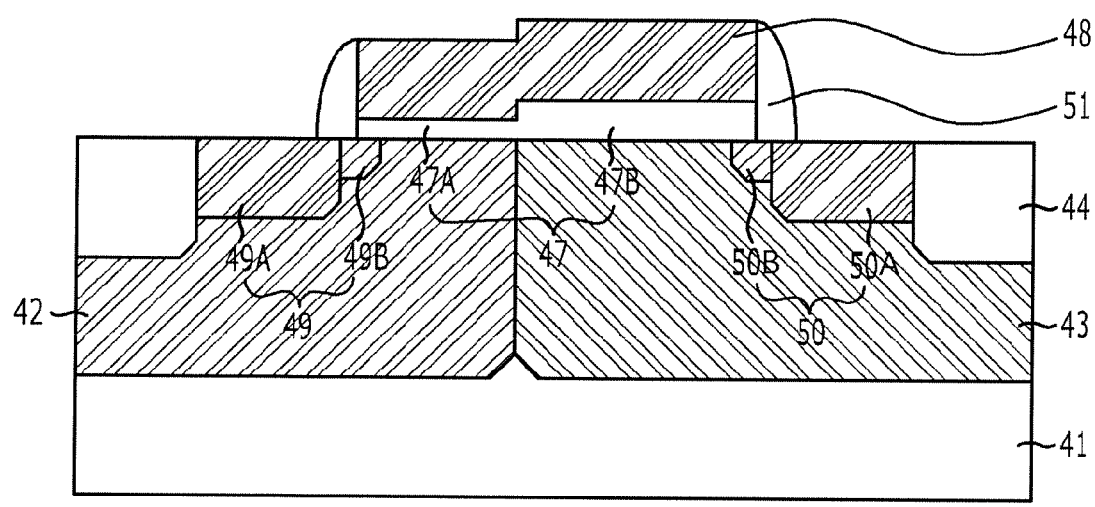

Referring to FIG. 9D, spacers 51 are formed on both sidewalls of the floating gate 48 and the gate dielectric layer 47, and a drain region 49 of the second conductivity type is formed in the first logic well 42 on one side of the floating gate 48. A source region 50 of the second conductivity type is formed in the second logic well 43 on the other side of the floating gate 48.

The drain region 49 and the source region 50 may have an LDD structure with heavily doped regions 49A and 50A and lightly doped regions 49B and 50B.

Figure 9E:
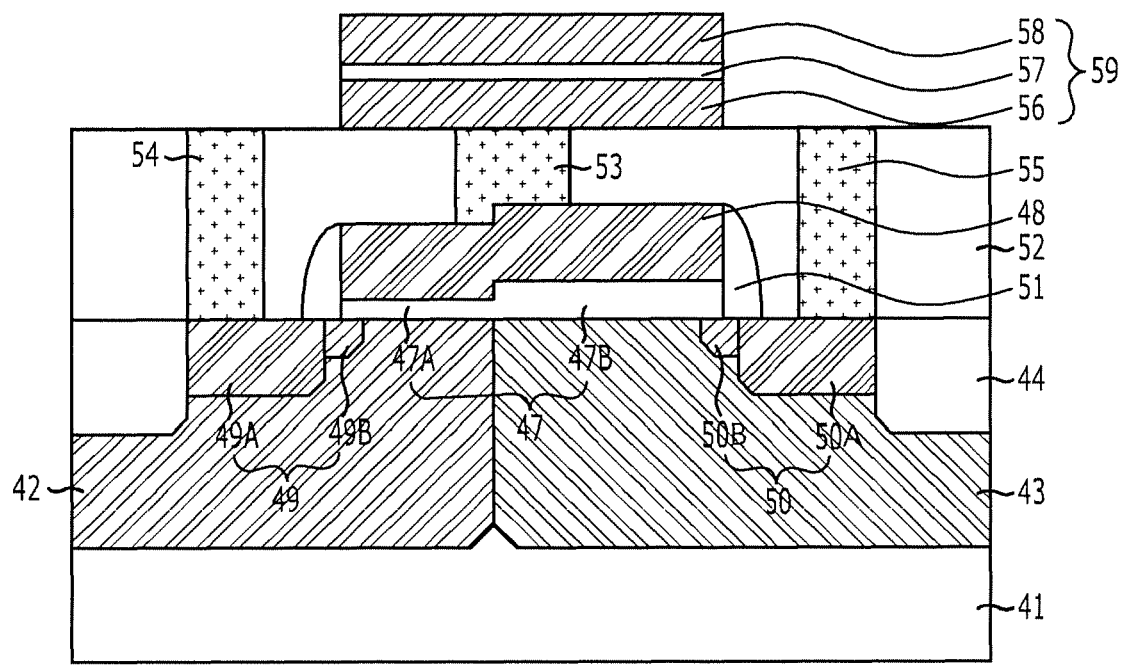

Referring to FIG. 9E, a first interlayer dielectric layer 52 is formed to cover the substrate 41. A first plug 53 passing through the first interlayer dielectric layer 52 and coupled to the floating gate 48, a second plug 54 coupled to the drain region 49, and a third plug 55 coupled to the source region 50 are formed.

A capacitor 59 is formed on the first interlayer dielectric layer 52. The capacitor 59 has a structure in which a bottom electrode 56, a dielectric layer 57, and a top electrode 58 are sequentially stacked. In the capacitor 59, the bottom electrode 56 is formed to contact the first plug 53.

In order for the capacitor 59 to have a maximum capacitance within the limited area, the dielectric layer 57 is formed of a material having a high dielectric constant. Also, the capacitor 59 may have any one shape selected from the group consisting of a flat plate shape, a concave shape, a convex shape, a cylindrical shape, and a pillar shape.

Figure 9F:
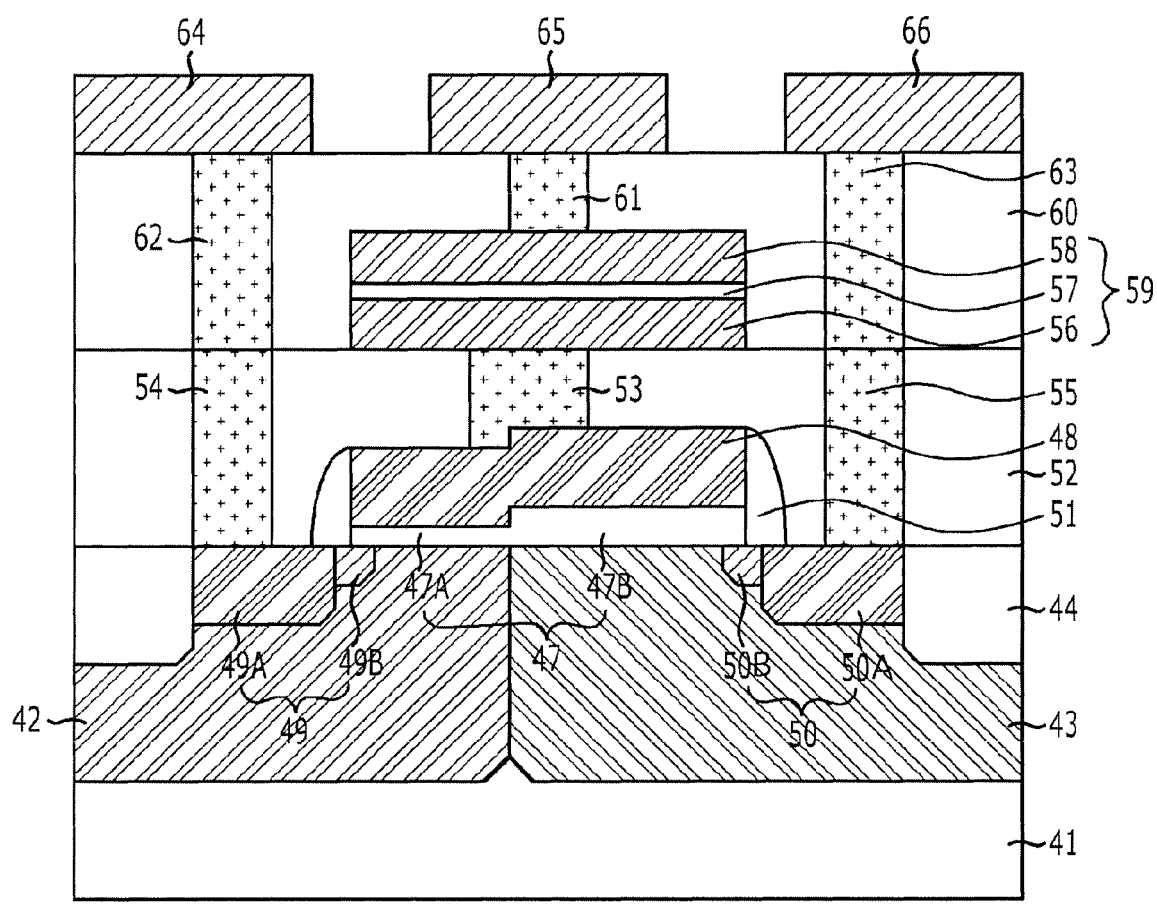

Referring to FIG. 9F, a second interlayer dielectric layer 60 is formed on the first interlayer dielectric layer 52 to cover the capacitor 59. A fourth plug 61 passing through the second interlayer dielectric layer 60 and coupled to the top electrode of the capacitor 59, a fifth plug 62 coupled to the second plug 54, and a sixth plug 63 coupled to the third plug 55 are formed.

A word line 65 coupled to the fourth plug 61, a bit line 64 coupled to the fifth plug 62, and a source line 66 coupled to the sixth plug 63 are formed on the second interlayer dielectric layer 60.

The nonvolatile memory device, that is, the CJH cell, in accordance with the embodiment of the present invention may be fabricated using the above-described processes. Since the CJH cell is fabricated using the logic process, a low cost process and a high efficiency process can be achieved. Furthermore, methods for fabricating CJH cells in accordance with various modifications of the present invention can be easily understood from the above-described fabricating method by those skilled in the art.

Since the nonvolatile memory device in accordance with the embodiment of the present invention performs the program operation, the erase operation, the read operation, and the select operation through a simple structure in which one transistor and one capacitor are coupled together, it can be easily applied to the SoC. Also, since the nonvolatile memory device has a simple structure, an area of a unit cell is small and thus it is easy to integrate the nonvolatile memory device into an SoC.

Furthermore, since the nonvolatile memory device is implemented with elements of the logic device by using a logic process, without additional mask process, a low cost process and a high efficiency process can be achieved. Moreover, the nonvolatile memory device can prevent degradation in characteristics of the logic device within the SoC.

While the present invention has been described with respect to the specific embodiments, it will be apparent to those skilled in the art that various changes and modifications may be made without departing from the spirit and scope of the invention as defined in the following claims.

What is claimed is:

1. A unit cell of a nonvolatile memory device, comprising: a transistor and a capacitor,
wherein the transistor comprises:
a tunneling region disposed in a substrate;
a channel region contacting with the tunneling region;
a drain region disposed in the tunneling region;
a source region disposed in the channel region;
a floating gate crossing both the tunneling region and the channel region;
a spacer disposed on both sidewalls of the floating gate; and
a first gate dielectric layer having a first thickness disposed between the tunneling region and the floating gate;
a second gate dielectric layer having a second thickness greater than the first thickness disposed between the channel region and the floating gate; and
wherein the capacitor is coupled to the floating gate through a contact plug,
wherein each the drain region and the source region comprises a lightly doped region and a highly doped region, and
the lightly doped region has shallower depth than the highly doped region, and
the lightly doped region and the highly doped region are partially overlapped with the spacer, and the drain region is symmetrical with respect to the source region,
wherein a change in the thickness between the first gate dielectric layer to the second gate dielectric layer starts from a boundary between the tunneling region and the channel region.

2. The nonvolatile memory device of claim 1, wherein the tunneling region and the channel region comprise impurity regions formed in the substrate and having complementary conductivity types.

3. The nonvolatile memory device of claim 1, wherein the tunneling region comprises a first impurity region of a second conductivity type, and the channel region comprises a second impurity region of a first conductivity type.

4. The nonvolatile memory device of claim 3, wherein the first impurity region and the second impurity region comprise logic wells.

5. The nonvolatile memory device of claim 3, wherein the first impurity region and the second impurity region are in contact with each other under the floating gate.

6. The nonvolatile memory device of claim 3, wherein the first impurity region and the second impurity region are spaced apart from each other by a predetermined interval under the floating gate.

7. The nonvolatile memory device of claim 3, wherein the first impurity region and the second impurity region are partially overlapped with each other under the floating gate.

8. The nonvolatile memory device of claim 7, further comprising an isolation layer disposed in the first impurity region and overlapped with one end of the floating gate.

9. The nonvolatile memory device of claim 1, wherein the capacitor has any one shape selected from the group consisting of a flat plate shape, a concave shape, a convex shape, a cylindrical shape, and a pillar shape.

10. The nonvolatile memory device of claim 1, wherein the unit cell further comprises a junction region in the substrate on one side of the floating gate, on the other side of the floating gate, or on both sides of the floating gate.

11. The nonvolatile memory device of claim 1, further comprising a driving unit configured to control a driving of the unit cell.

12. The nonvolatile memory device of claim 11, wherein the driving unit comprises an NMOS transistor, a PMOS transistor, or a CMOS transistor in which the NMOS transistor and the PMOS transistor are coupled.

13. The nonvolatile memory device of claim 12, wherein the NMOS transistor comprises:
an N-type impurity region and a P-type impurity region disposed in the substrate;
a gate electrode disposed on the substrate and crossing both the N-type impurity region and the P-type impurity region;
a gate dielectric layer disposed between the substrate and the gate electrode;
an N-type drain region disposed in the N-type impurity region on one side of the gate electrode; and
an N-type source region disposed in the P-type impurity region on the other side of the gate electrode.

14. The nonvolatile memory device of claim 13, further comprising an isolation layer disposed in the N-type impurity region, overlapped with one end of the gate electrode, and spacing the N-type drain region from the gate electrode by a predetermined interval.

15. The nonvolatile memory device of claim 13, wherein the substrate comprises a P-type substrate, the N-type impurity region comprises a logic well, and the P-type impurity region comprises the P-type substrate.

16. The nonvolatile memory device of claim 12, wherein the PMOS transistor comprises:
a P-type impurity region and an N-type impurity region disposed in the substrate;
a gate electrode disposed on the substrate and crossing both the P-type impurity region and the N-type impurity region;
a gate dielectric layer disposed between the substrate and the gate electrode;
a P-type drain region disposed in the P-type impurity region on one side of the gate electrode; and
a P-type source region disposed in the N-type impurity region on the other side of the gate electrode.

17. The nonvolatile memory device of claim 16, further comprising an isolation layer disposed in the P-type impurity region, overlapped with one end of the gate electrode, and spacing the P-type drain region from the gate electrode by a predetermined interval.

18. The nonvolatile memory device of claim 16, wherein the substrate comprises an N-type substrate, the P-type impurity region comprises a logic well, and the N-type impurity region comprises the N-type substrate.

19. The nonvolatile memory device of claim 17, wherein the P-type impurity region and the N-type impurity region comprise logic wells.

20. The nonvolatile memory device of claim 19, wherein the P-type impurity region and the N-type impurity region are in contact with each other under the gate electrode.

21. The nonvolatile memory device of claim 19, wherein the P-type impurity region and the N-type impurity region are spaced apart from each other by a predetermined interval under the gate electrode.

22. The nonvolatile memory device of claim 19, wherein the P-type impurity region and the N-type impurity region are partially overlapped with each other under the gate electrode.

23. The nonvolatile memory device of claim 1, wherein only the first gate dielectric is disposed in the tunneling region and only the second gate dielectric is disposed on the channel region.

24. A nonvolatile memory device, comprising:
a first well having a second conductivity type disposed in a substrate;
a second well having a first conductivity type and contacted with the first well;
a floating gate disposed on the substrate and crossing both the first well and the second well;
a gate dielectric layer disposed between the substrate and the floating gate;
a first isolation layer disposed in the first well overlapped with the floating gate;
a drain region having the second conductivity disposed in the first well and spaced apart from the floating gate by the first isolation layer;
a source region having the second conductivity type disposed in the second well on the other side of the floating gate;
a capacitor having a structure in which a bottom electrode, a dielectric layer, and a top electrode are sequentially stacked, and the bottom electrode is coupled to the floating gate; and
a spacer disposed on sidewalls of the floating gate;
wherein the first isolation layer is in contact with the drain region,
wherein the source region comprises a lightly doped region and a highly doped region, and the lightly doped region has a shallower depth than the highly doped region, and the drain region and the first isolation layer are partially overlapped with the spacer, wherein the spacer is in contact with a boundary between the first isolation layer and the drain region.

25. The nonvolatile memory device of claim 24, wherein the first well and the second well are in contact with each other under the floating gate.

26. The nonvolatile memory device of claim 24, wherein the first well and the second well are spaced apart from each other by a predetermined interval under the floating gate.

27. The nonvolatile memory device of claim 24, wherein the first well and the second well are partially overlapped with each other under the floating gate.

28. The nonvolatile memory device of claim 27, wherein the first isolation layer is overlapped with the floating gate.

29. The nonvolatile memory device of claim 24, wherein the gate dielectric layer comprises a first gate dielectric layer on the first well and a second gate dielectric layer on the second well, and the thickness of the first gate dielectric layer is substantially equal to the thickness of the second gate dielectric layer.

30. The nonvolatile memory device of claim 24, wherein the gate dielectric layer comprises a first gate dielectric layer on the first well and a second gate dielectric layer on the second well, and the thickness of the second gate dielectric layer is larger than the thickness of the first gate dielectric layer.

31. The nonvolatile memory device of claim 24, wherein the capacitor has any one shape selected from the group consisting of a flat plate shape, a concave shape, a convex shape, a cylindrical shape, and a pillar shape.

32. The nonvolatile memory device of claim 24, further comprising:
a word line coupled to the top electrode of the capacitor;
a bit line coupled to the drain region; and
a source line coupled to the source region.

33. The nonvolatile memory device of claim 32, wherein, upon a program operation, a program voltage is applied to the word line and a ground voltage is applied to the bit line.

34. The nonvolatile memory device of claim 32, wherein, upon an erase operation, an erase voltage is applied to the bit line and a ground voltage is applied to the word line.

35. The nonvolatile memory device of claim 34, wherein the source line is floated.

36. The nonvolatile memory device of claim 32, wherein, upon a read operation, a read voltage is applied to the word line, a voltage higher or lower than a ground voltage is applied to the bit line, and the ground voltage is applied to the source line.

37. The nonvolatile memory device of claim 24, wherein the spacer reaches to a portion of the drain region starting from a portion of the isolation layer.

38. The nonvolatile memory device of claim 24, further comprising a second isolation layer in contact with the drain region.

39. The nonvolatile memory device of claim 38, wherein the spacer is in contact with the drain region between the first isolation layer and the second isolation layer.

* * * * *